(12) United States Patent
Kitaoka et al.

(10) Patent No.: US 6,614,966 B2
(45) Date of Patent: Sep. 2, 2003

(54) OPTICAL WAVEGUIDE DEVICE INTEGRATED MODULE AND METHOD OF MANUFACTURING THE SAME

(75) Inventors: Yasuo Kitaoka, Osaka (JP); Toshifumi Yokoyama, Osaka (JP); Kazuhisa Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 113 days.

(21) Appl. No.: 09/801,223

(22) Filed: Mar. 7, 2001

(65) Prior Publication Data

US 2001/0024552 A1 Sep. 27, 2001

(30) Foreign Application Priority Data

Mar. 22, 2000 (JP) ........................................ 2000-080888

(51) Int. Cl.[7] ................................................. G02B 6/26
(52) U.S. Cl. ............................. 385/52; 372/43; 372/75
(58) Field of Search ............................. 385/88–94, 49, 385/52; 372/43, 75

(56) References Cited

U.S. PATENT DOCUMENTS

| 5,321,786 | A | | 6/1994 | Valette et al. | |
|---|---|---|---|---|---|
| 5,665,473 | A | * | 9/1997 | Okoshi et al. | 428/457 |
| 5,721,797 | A | | 2/1998 | Basavanhally et al. | |
| 5,835,650 | A | * | 11/1998 | Kitaoka et al. | 385/49 |
| 6,009,218 | A | | 12/1999 | Grand et al. | |
| 6,483,968 | B2 | * | 11/2002 | Fuse et al. | 385/49 |

FOREIGN PATENT DOCUMENTS

| DE | 40 29 559 | 3/1992 |
|---|---|---|
| EP | 0 541 386 | 5/1993 |
| EP | 0 588 675 | 3/1994 |
| EP | 0 811 863 | 12/1997 |
| GB | 2 329 486 | 3/1999 |

OTHER PUBLICATIONS

Kazuhisa Yamamoti, et al.; "Milliwatt–order blue–light generation in a periodically domain–inverted LiTaO$_3$ waveguide"; *Optics Letters*; Aug. 1, 1991; vol. 16, No. 15, pp. 1156–1158.

K. Suekuni, et al.; "PD–20 A Cell Gap Simulation"; *Japan Display*; 1992; p. 894.

T. Nishikawa, et al.; "Surface Mounting LD Module on a Silicon Substrate"; Institute of Electronics, Information and Communication Engineers Conference C–3–63; 1997; p. 248 (full English translation attached).

* cited by examiner

*Primary Examiner*—Robert H. Kim
*Assistant Examiner*—Michael H Caley
(74) *Attorney, Agent, or Firm*—Merchant & Gould P.C.

(57) ABSTRACT

A semiconductor laser and an optical waveguide device with an optical waveguide formed at a surface of its substrate are provided on a submount. The semiconductor laser and the optical waveguide device are mounted with an active layer and a surface at which the optical waveguide is formed facing the submount, respectively. The submount is combined with the semiconductor laser or the optical waveguide device to form one body using an adhesive with a spacer, which maintains a substantially uniform distance therebetween, being interposed therebetween, so that position adjustment in the height direction can be made automatically and mounting can be carried out with high-precision optical coupling. Thus, an optical waveguide device integrated module and a method of manufacturing the same are provided, in which a semiconductor laser and a planar optical waveguide device are mounted with their positions in the height direction controlled with high precision.

61 Claims, 13 Drawing Sheets

OPTICAL WAVEGUIDE DEVICE INTEGRATED MODULE AND METHOD OF MANUFACTURING THE SAME

BACKGROUND OF THE INVENTION

1. Field of the Invention

The present invention relates generally to an optical waveguide device integrated module with a semiconductor laser and an optical waveguide device that are mounted on a submount and to a method of manufacturing the same.

2. Related Background Art

In the optical communication field, it is considered important to develop a hybrid integrated optical module including a semiconductor laser, an electronic element, an optical fiber, and the like that are integrated on a quartz-based lightwave circuit platform. This is an indispensable technique for reducing the size and cost of modules. In the technique, it is important to fix each element with high precision to minimize transfer-loss.

A surface mounting optical module has been proposed in which a semiconductor laser and a single mode fiber are bonded directly using a V-groove groove Si substrate (IEICE (The Institute of Electronics, Information and Communication Engineers) Conference 1997, C-3-63). FIG. 12 shows a structural view. Alignment keys 26 are formed in a Si substrate 24 and a semiconductor laser 25. The alignment keys 26 are subjected to image recognition, so that the center of a V-groove 27 and a position of an emission point of the semiconductor laser 25 are detected. Thus, position adjustment is carried out with high precision. Mounting variations of about ±0.61 µm in the x direction and about ±1 µm in the z direction are achieved with respect to the V-groove 27 of the Si substrate 24. An optical fiber 28 is mounted in the V-groove 27 accurately. The V-groove 27 is formed with high precision by anisotropic etching of Si. Similarly, the optical fiber 28 is produced with its outer dimension and core center controlled with high precision. Therefore, the fiber 28 is fitted into and is fixed to the V-groove 27, so that the optical fiber 28 can be fixed with respect to the semiconductor laser 25 with high precision.

On the other hand, in order to achieve the increases in density of optical disks and in definition of a display, a small short-wavelength light source is required. Techniques for obtaining short wavelength light include blue light generation using a semiconductor laser and an optical waveguide second harmonic generation (hereinafter referred to as "SHG") device employing a quasi-phase-matched (hereinafter referred to as "QPM") system (Yamamoto et al., Optics Letters Vol. 16, No. 15, p1156, (1991)).

FIG. 13 shows a schematic structural view of a blue light source using an optical waveguide QPM-SHG device. A wavelength variable semiconductor laser having a distributed Bragg reflector (hereinafter referred to as "DBR") region (hereinafter referred to as a "wavelength-variable DBR semiconductor laser") is used as a semiconductor laser. Numeral 29 is a 100-mW class AlGaAs-based wavelength-variable DBR semiconductor laser in a 0.85-µm range. The semiconductor laser includes an active layer region and a DBR region. An amount of current applied to the DBR region is varied, so that the emission wavelength can be varied.

An optical waveguide QPM-SHG device 30 as a wavelength conversion device includes an optical waveguide and a region whose polarization is reversed periodically, which are formed on a x-cut Mg-doped $LiNbO_3$ substrate. A $SiO_2$ protective film 31 is formed on the surface at which the optical waveguide is formed. The wavelength-variable DBR semiconductor laser 29 and the optical waveguide QPM-SHG device 30 are fixed so that the active layer and the surface at which the optical waveguide is formed are in contact with a submount 32, respectively (hereinafter referred to as "face down mounting"). A laser beam obtained from an emission surface (from which a beam leaves the laser 29) of the wavelength-variable DBR semiconductor laser 29 is coupled directly to the optical waveguide of the optical waveguide QPM-SHG device 30.

The optical coupling adjustment is carried out with the semiconductor laser emitting a beam, and with respect to a 100-mW laser output, a 60-mW laser beam was coupled to the optical waveguide. The amount of current applied to the DBR region of the wavelength-variable DBR semiconductor laser is controlled and thus the emission wavelength is set within a tolerance of the phase matched wavelength of the optical waveguide QPM-SHG device. Currently, about 10-mW blue light with a wavelength of 425 nm has been obtained.

In an optical module in which a semiconductor laser and an optical fiber are integrated, the optical fiber is mounted in a V-groove formed in a Si submount and the semiconductor laser is mounted using the V-groove as a reference position. The optical fiber has a cylindrical shape and has a core portion (an optical propagation region) formed in its center. The optical fiber is formed with its diameter controlled with high precision. In addition, the V-groove in the Si submount also is formed with high precision using the anisotropic etching of Si. Therefore, the optical fiber is mounted with its core portion as the center of the optical fiber being adjusted with respect to the Si submount with high precision. On the other hand, the alignment keys used for positioning the semiconductor laser also are formed in reference to the V-groove and therefore the semiconductor laser also can be mounted with high accuracy.

In a planar optical waveguide device with an optical waveguide formed on a surface of a $LiNbO_3$ substrate by proton exchange or Ti diffusion (devices other than optical waveguide devices with an optical waveguide layer (core) in the coaxial center like an optical fiber are referred to as "planar optical waveguide devices" in the present invention), the distance from the substrate surface to the optical waveguide is controlled with high precision. In an integrated module including a semiconductor laser and a planar optical waveguide device, the semiconductor laser is fixed with a solder material and the optical waveguide device is fixed with an adhesive by face down mounting. In the semiconductor laser, generally, an active layer is formed on an n-type substrate, and a P-type clad layer and further a p-side electrode are formed thereon. Therefore, the distance from the p-side surface to the active layer is about 3 µm. The solder material has a thickness of about 1 to 2 µm. Consequently, the distance from the submount to the active layer after mounting is about 4 to 5 µm. This distance can be controlled to be about ±0.2 µm through the adjustment of the amount of pressure applied to the semiconductor laser during the mounting.

On the other hand, since the optical waveguide portion of the planar optical waveguide device is formed at the substrate surface, the distance from the substrate to the optical waveguide portion is about 1 µm. Therefore, there is a difference in level of about 3 to 4 µm between the active layer of the semiconductor laser and the optical waveguide portion of the optical waveguide device. Consequently, it has been difficult to carry out the adjustment without allowing the semiconductor laser to emit a beam (hereinafter referred to as "passive alignment mounting").

A method has been proposed in which a thick film is formed on a planar optical waveguide device to allow the levels of an active layer of a semiconductor laser and an optical waveguide portion of the planar optical waveguide device to coincide with each other. This method, however, has the following problems.

(1) Conditions for manufacturing the optical waveguide vary due to the increase in temperature of a substrate during the formation of the thick film. Particularly, in the case of a SHG device employing the QPM system, a phase matched wavelength may vary and the wavelength conversion characteristics may deteriorate with the variation in refractive index of the optical waveguide.

(2) After being formed, the thick film shrinks and therefore, a substrate may warp. The warping makes it difficult to mount the device on a submount.

(3) The thick film has a thickness of about several micrometers. Therefore, it is difficult to control the thickness to be uniform.

(4) In fixing the optical waveguide device with an adhesive, when the thickness of the adhesive is not uniform, heat from the submount cannot be conducted uniformly. Therefore, particularly in the wavelength conversion device employing the QPM system, the phase matched wavelength may vary or the wavelength conversion characteristics may deteriorate.

On the other hand, in the adjustment of optical coupling between the semiconductor laser and the planar optical waveguide device in the width direction, conventionally, an adhesive was applied after the optical coupling adjustment and then was dried to fix them. Therefore, misalignment after the adjustment might be caused by the stress exerted during the application of the adhesive or the shrinkage of the adhesive upon curing.

In the optical waveguide QPM-SHG device utilizing the second harmonic generation, the power of harmonic light obtained is proportional to the square of the power of a fundamental wave to be coupled. Therefore, it is indispensable to improve the coupling efficiency and reduce the variations among samples.

SUMMARY OF THE INVENTION

Therefore, it is an object of the present invention to solve the above-mentioned problems and to provide an optical waveguide device integrated module in which a semiconductor laser and a planar optical waveguide device are mounted with their positions in their height direction controlled with high precision and to provide a mounting method for manufacturing the same.

In order to achieve the aforementioned object, an optical waveguide device integrated module according to the present invention includes a semiconductor laser and an optical waveguide device on a submount. The optical waveguide device includes an optical waveguide formed on a surface of its substrate. The semiconductor laser and the optical waveguide device are mounted on the submount with both a surface of the semiconductor laser at which an active layer is formed and a surface of the optical waveguide device at which the optical waveguide is formed facing the submount. The submount is combined with the semiconductor laser or the optical waveguide device to form one body using an adhesive with a spacer being interposed therebetween. The spacer maintains a substantially uniform distance between the submount and the semiconductor laser or the optical waveguide device.

A mounting method for manufacturing an optical waveguide device integrated module according to the present invention is directed to a mounting method for manufacturing an optical waveguide device integrated module including a semiconductor laser and an optical waveguide device mounted on a submount with both a surface of the semiconductor laser at which an active layer is formed and a surface of the optical waveguide device at which an optical waveguide is formed facing the submount. The method includes mounting at least one of the semiconductor laser and the optical waveguide device on the submount with an adhesive, with a spacer between the submount and the semiconductor laser or the optical waveguide device. The spacer maintains a substantially uniform distance between the submount and the semiconductor laser or the optical waveguide device.

DETAILED DESCRIPTION OF THE INVENTION

Figure 1:
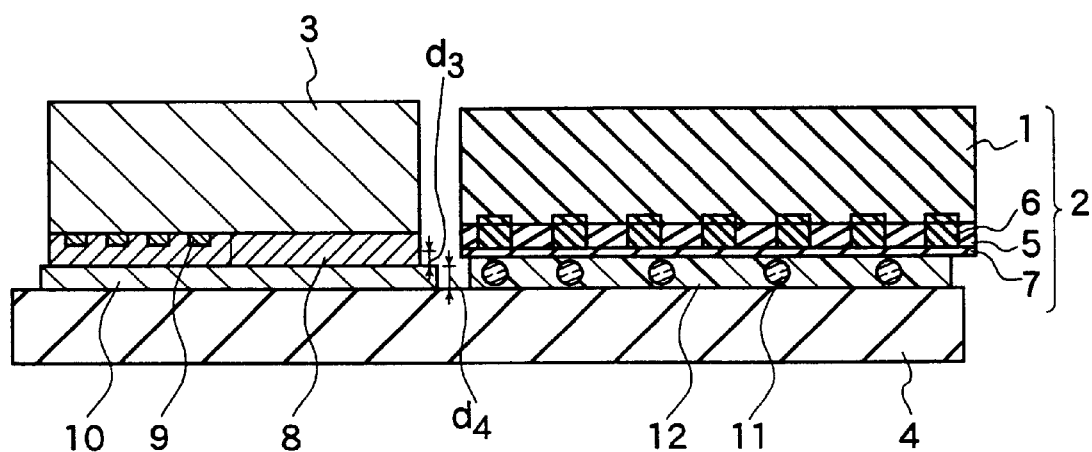
FIG. 1 is a structural view of a SHG blue light source according to a first embodiment of the present invention.

In the present invention, a spacer is used that can maintain a substantially uniform distance between the submount and the semiconductor laser or the optical waveguide device when pressure is applied during the mounting. In this context, the "substantially uniform distance" denotes a distance, preferably, within a variation range of about 10%. A spacer with a regular shape such as a spherical or cylindrical shape can be used preferably.

In the present invention, it is preferable that the distance from the submount surface to the optical waveguide is adjusted depending on a size of the spherical or cylindrical body so that a maximum coupling efficiency is obtained in coupling a beam emitted from the semiconductor laser to the optical waveguide.

It is preferable that a plurality of spherical or cylindrical bodies are present.

Preferably, the spherical or cylindrical bodies are arranged in a single layer between the submount and the optical waveguide device or the semiconductor laser. In this specification, the description that "the spherical or cylindrical bodies are arranged in a single layer" denotes that the respective spherical or cylindrical bodies are arranged so as not to overlie on top of another.

Preferably, the spherical or cylindrical body is mixed with an adhesive in the semiconductor laser.

It is preferable that an amount of the spherical or cylindrical bodies mixed with the adhesive is not more than 30 vol. %, further preferably in the range of 0.1 vol. % to 20 vol. %.

Preferably, the spherical or cylindrical bodies have substantially the same size. In this context, the term "substantially" denotes that their sizes may differ from one another slightly, and specifically, a difference of ±10% is allowable.

Preferably, the optical waveguide device is a quasi-phase-matched wavelength conversion device with a region whose polarization is reversed periodically.

In addition, it is preferable that the spherical or cylindrical body is formed of at least one material selected from a group consisting of glass materials, resins such as acrylic resin, polydivinylbenzene-containing resin, formaldehyde condensate resin and the like, and ceramics.

Preferably, the adhesive in the optical waveguide device has been cured by irradiation of ultraviolet rays.

Preferably, the adhesive used for fixing the semiconductor laser is a solder or a conductive adhesive.

Preferably, the spherical body has a mean grain size of not more than 10 $\mu$m, further preferably in a range of 1 $\mu$m to 9 $\mu$m.

Preferably, the cylindrical body has a mean length of 10 $\mu$m to 100 $\mu$m.

Furthermore, it is preferable that a relationship of $d_1+d_2+\Delta \cong d_3+d_4$ is satisfied, where $d_1$ denotes a diameter of the spherical or cylindrical body, $d_2$ a distance from the surface of the optical waveguide device to a position where an intensity of a laser beam waveguide mode of the optical waveguide reaches its peak, $d_3$ a distance from the surface of the semiconductor laser at which the active layer is formed to a position where an intensity of a laser beam emitted from the semiconductor laser reaches its peak, $d_4$ a thickness of the adhesive used for mounting the semiconductor laser on the submount, and $\Delta$ a distance between the position where an intensity of a laser beam waveguide mode of the optical waveguide reaches its peak and a position where a maximum optical coupling efficiency is obtained in coupling a beam emitted from the semiconductor laser to the optical waveguide.

It also is preferable that $\Delta \cong 0$ and $\Delta = \alpha$ when the laser beam waveguide mode of the optical waveguide has a symmetric shape and an asymmetric shape with respect to the direction of a thickness of the substrate, where $\alpha$ denotes the distance between the position where an intensity of a laser beam waveguide mode of the optical waveguide reaches its peak and the position where a maximum optical coupling efficiency is obtained in coupling a beam emitted from the semiconductor laser to the optical waveguide.

In the mounting method according to the present invention, it is preferable that an optical coupling adjustment in the optical waveguide device is carried out with the semiconductor laser emitting a beam.

Preferably, the adhesive is ultraviolet curable resin that is cured by irradiation of ultraviolet rays. Ultraviolet curable resins that can be used in the present invention include those prepared by mixing, for example, acrylic monomer, oligomer (such as polyester-, polyurethane-, or epoxy-acrylic ester with a molecular weight of about 1000 to 5000, or the like), a photoinitiator (benzophenone, benzoin ethyl ether, or the like), and a polymerization inhibitor.

In the mounting method of the present invention, it is preferable that the adhesive is applied to the submount, an adjustment in optical coupling between the semiconductor laser and the optical waveguide device is carried out with the adhesive being present between the optical waveguide device and the submount, and then the optical waveguide device is fixed.

Preferably, the adhesive has a viscosity of not more than 100 cps.

It also is preferable that a center position of a load applied in mounting the optical waveguide device or the semiconductor laser on the submount is: in the vicinity of the spherical or cylindrical bodies when the spherical or cylindrical bodies are positioned in one place; on a line extending between two points when the spherical or cylindrical bodies are positioned in two places; or inside a region defined by lines extending between three points or more when the spherical or cylindrical bodies are positioned in three places or more; and on the optical waveguide device or the semiconductor laser.

Preferably, the area of a portion of a jig used in mounting the optical waveguide device or the semiconductor laser on the submount coming into contact with the optical waveguide device or the semiconductor laser is smaller than the area of the optical waveguide device or the semiconductor laser.

Preferably, at least one of the optical waveguide device and the semiconductor laser is mounted on the submount while a load is applied to the at least one. Particularly, it is preferable that the load applied to the optical waveguide device is not more than 500 g.

Preferably, the spherical or cylindrical body is mixed with the adhesive.

It also is preferable that a ratio of the spherical or cylindrical bodies mixed with the adhesive is not more than 30 vol. %.

Preferably, the position of the optical waveguide device is adjusted with the semiconductor laser emitting a beam and then the optical waveguide device is mounted on the submount.

Preferably, the spherical or cylindrical bodies have substantially the same size. In this context, the term "substantially" denotes that their sizes may differ from one another slightly, and specifically, a difference of ±10% is allowable.

It is desirable that the adhesive used for fixing the semiconductor laser is a solder or a conductive adhesive.

In the optical waveguide device integrated module in which a semiconductor laser and a planar optical waveguide device are integrated, it is important to improve the coupling efficiency and to reduce the variations in the coupling efficiency among samples. Particularly, in a short-wavelength light source including a semiconductor laser and an optical waveguide QPM-SHG device, a power of harmonic light obtained is proportional to the square of a power of the fundamental wave to be coupled. Therefore, the improvement in the coupling efficiency and the reduction of the variations in the coupling efficiency among samples are particularly important factors. The module and mounting method according to the present invention can satisfy such important factors.

As described above, the present invention allows levels of the active layer of the semiconductor laser and the optical waveguide of the optical waveguide device to coincide with each other automatically. In addition, even when the adhesive shrinks upon being cured, it has less influence on the decrease in the coupling efficiency since the positioning in the height direction is made by the spherical or cylindrical bodies.

According to the mounting method of the present invention, the time required for mounting can be shortened. In addition, when the spherical or cylindrical bodies are mixed with an adhesive, the levels of the active layer of the semiconductor laser and the optical waveguide of the optical waveguide device are allowed to coincide with each other automatically. In addition, even when the adhesive shrinks upon being cured, it has less influence on the decrease in the coupling efficiency since the positioning in the height direction is made by the spherical or cylindrical bodies.

In the following embodiments, the descriptions are directed to a method of achieving high-efficiency optical coupling by controlling the thicknesses of an optical waveguide and an active layer with high precision in an optical waveguide device integrated module including a semiconductor laser and a planar optical waveguide device.

First Embodiment

In the present embodiment, the description is directed to a SHG blue light source with an optical waveguide quasi-phase-matched second harmonic generation (QPM-SHG) device as a planar optical waveguide device and a wavelength-variable DBR semiconductor laser as a semiconductor laser. The optical waveguide QPM-SHG device is produced on a Mg-doped LiNbO$_3$ substrate. The DBR semiconductor laser has a wavelength varying function.

In the present embodiment, spherical or cylindrical bodies are placed between the planar optical waveguide device and a submount, so that the position in the height direction of an optical waveguide in the planar optical waveguide device is controlled with high precision. Thus, high-efficiency optical coupling is achieved.

FIG. 1 shows a drawing illustrating the configuration of the SHG blue light source according to the present embodiment. The SHG blue light source includes an optical waveguide QPM-SHG device 2 and a wavelength-variable DBR semiconductor laser 3, which are mounted on a Si submount 4. The SHG device 2 includes a proton exchange optical waveguide 5 and a region 6 whose polarization is reversed periodically (hereinafter referred to as a "polarization reversed region"), which are formed on an x-cut Mg-doped LiNbO$_3$ substrate 1. The polarization reversed region 6 is produced by formation of a comb-shaped electrode on the +x plane of the LiNbO$_3$ substrate and application of an electric field. The difference in propagation velocity between fundamental wavelength light and second harmonic light is corrected by the polarization reversed region. Thus, a quasi phase matched condition is satisfied. A fundamental wave and a harmonic wave propagate in the proton exchange optical waveguide 5 as guided waves. Therefore, a long distance for interaction can be secured and thus high exchange efficiency can be achieved.

Figure 2:
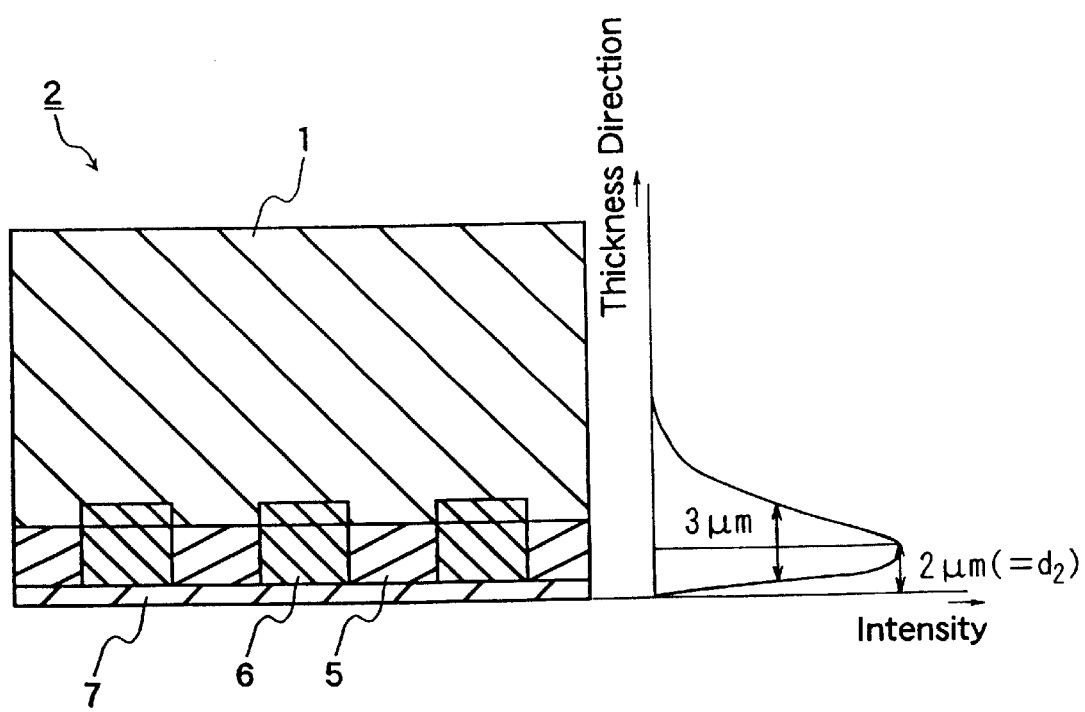
FIG. 2 is a diagram indicating a waveguide mode with respect to a fundamental wave of an optical waveguide QPM-SHG device according to the first embodiment of the present invention.

A SiO$_2$ protective film 7 (with a thickness of 200 nm) is formed on the proton exchange optical waveguide 5. FIG. 2 shows a waveguide mode of the fundamental wave. The fundamental wave had a full width at half maximum of 3 μm with respect to the thickness (height) direction and a distance from the substrate surface to a position where the intensity of the waveguide mode reached its peak was 2 μm.

The DBR semiconductor laser 3 is an AlGaAs-based semiconductor laser and has an emission wavelength of 820 nm. The semiconductor laser 3 includes an active region (an active layer) 8 and a DBR (distributed Bragg reflector) region 9 with diffraction gratings formed therein. Light from the DBR region 9 corresponding to the pitch of the diffraction grating enters to and is fed back from the active layer 8 and resonates between the end face of the active region 8 from which light leaves and the DBR region 9. The emission wavelength is set to be the wavelength of the light fed back from the active layer (hereinafter referred to as a "feedback wavelength"). In the DBR region 9, an internal heater is provided. Current application to the internal hater allows the refractive index of the diffraction grating of the DBR region 9 to vary. This can vary the feedback wavelength and thus the emission wavelength. A wavelength variable range of 2 nm is achieved.

An n-type clad layer and an active layer are formed on an n-type GaAs substrate, and a p-type clad layer and further a p-side electrode were formed thereon. The distance from the p-side surface (i.e. the surface at which the active layer was formed) to an emission center was 3 μm.

On the Si submount, a Ti/Pt/Au metallization film is formed, and a Pb/Sn solder 10 is provided, by vapor deposition, in a portion on which the semiconductor laser is to be mounted. The solder material has a thickness of 3 μm. The amount of pressure applied to the DBR semiconductor laser during mounting was adjusted, so that the thickness of the solder material after fixing was set to be 2 μm. As a result, the distance from the Si submount 4 to the emission center (i.e. a position where the intensity of an emitted laser beam reaches its peak) after the mounting was 5 μm.

As described above, the emission center of the semiconductor laser is located 5 μm apart from the Si submount in the height direction. On the other hand, the distance from the surface of the substrate of the SHG device 2 to the position where the intensity of the waveguide mode reaches its peak is 2 μm. Therefore, it is necessary for optical coupling with high efficiency to adjust the position in the height direction of the SHG device 2. In the present embodiment, spherical glass beads 11 are interposed between the SHG device 2 and the Si submount 4, so that the thickness is adjusted. The variation in mean grain size of the glass beads 11 is not more than ±0.1 μm, and this enables position adjustment in the height direction with high precision. Practically, the size of the spherical glass beads 11 was determined so that the maximum optical coupling efficiency in coupling between the waveguide mode of the SHG device 2 and the emission mode of the semiconductor laser was obtained.

The method of determining the size of the spherical glass beads 11 is described in detail as follows. Suppose the diameter of spherical or cylindrical bodies is indicated as $d_1$, the distance from the surface of the optical waveguide QPM-SHG device to the position where the intensity of the laser optical waveguide mode of the optical waveguide reaches its peak as $d_2$ (FIG. 2), the distance from the surface of the semiconductor laser at which the active layer is formed to the position of the active layer (i.e. the distance corresponding to half the thickness of the active layer) as $d_3$ (FIG. 1), and the thickness of the solder film used for mounting the semiconductor laser on the submount as $d_4$ (FIG. 1). In the present embodiment, $d_2=2$ μm, $d_3=3$ μm, and $d_4=2$ μm. In this case, the maximum optical coupling efficiency in coupling between the waveguide mode of the SHG device 2 and the emission mode of the semiconductor laser cannot always be obtained merely by using the glass beads 11 with a diameter $d_1$ of 3 μm so that the relationship of $d_1+d_2 \cong d_3+d_4$ is satisfied. As shown in FIG. 2, the laser beam waveguide mode of the optical waveguide in the SHG device used in the present embodiment is asymmetric with respect to the intensity peak. When the laser beam waveguide mode is asymmetric with respect to the intensity peak as in this case, the distance from the surface of the SHG device to the position where the maximum optical coupling efficiency in coupling between the laser beam waveguide mode of the optical waveguide and the emission mode of the semiconductor laser is obtained is $d_2+\Delta$.

Figure 3:
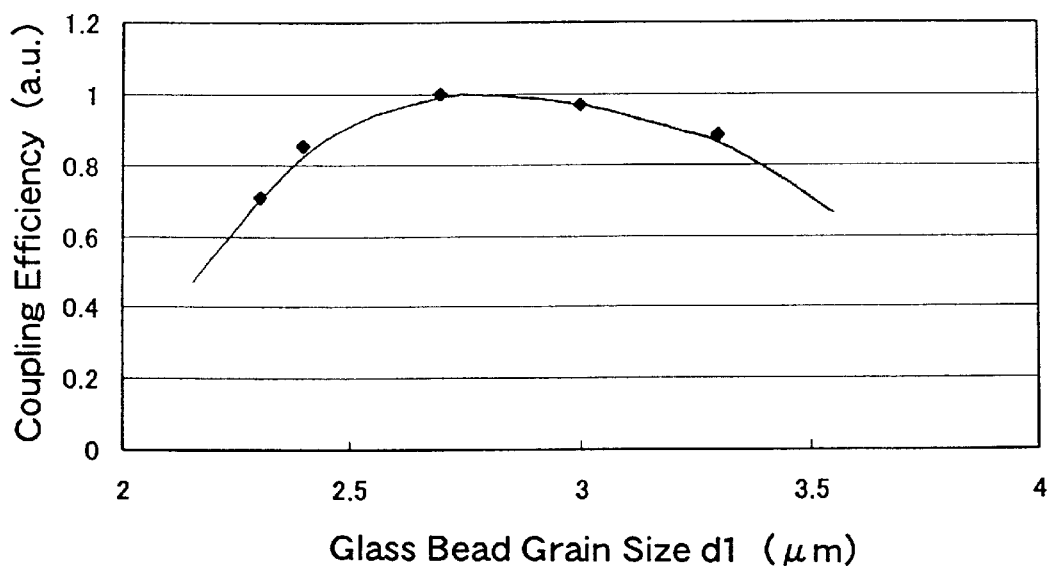
FIG. 3 is a graph showing variations in maximum optical coupling efficiency in coupling between an emission mode of a semiconductor laser and a waveguide mode of the optical waveguide QPM-SHG device according to the first embodiment of the present invention when the diameter of a glass bead is changed.

FIG. 3 shows the variation in maximum optical coupling efficiency in the coupling between the emission mode of the semiconductor laser and the waveguide mode of the SHG device 2 when the diameter $d_1$ of the glass beads 11 is changed. As shown in FIG. 3, when the glass beads 11 have a diameter $d_1$ of 2.7 μm, the maximum optical coupling efficiency was obtained. From the result described above, since $d_1=2.7$ μm, $d_2=2$ μm, $d_3=3$ μm, and $d_4=2$ μm, $\Delta \cong 0.3$ μm when the relationship of $d_1+d_2+\Delta \cong d_3+d_4$ is satisfied In this case, a maximum optical coupling efficiency can be obtained.

Figure 4:
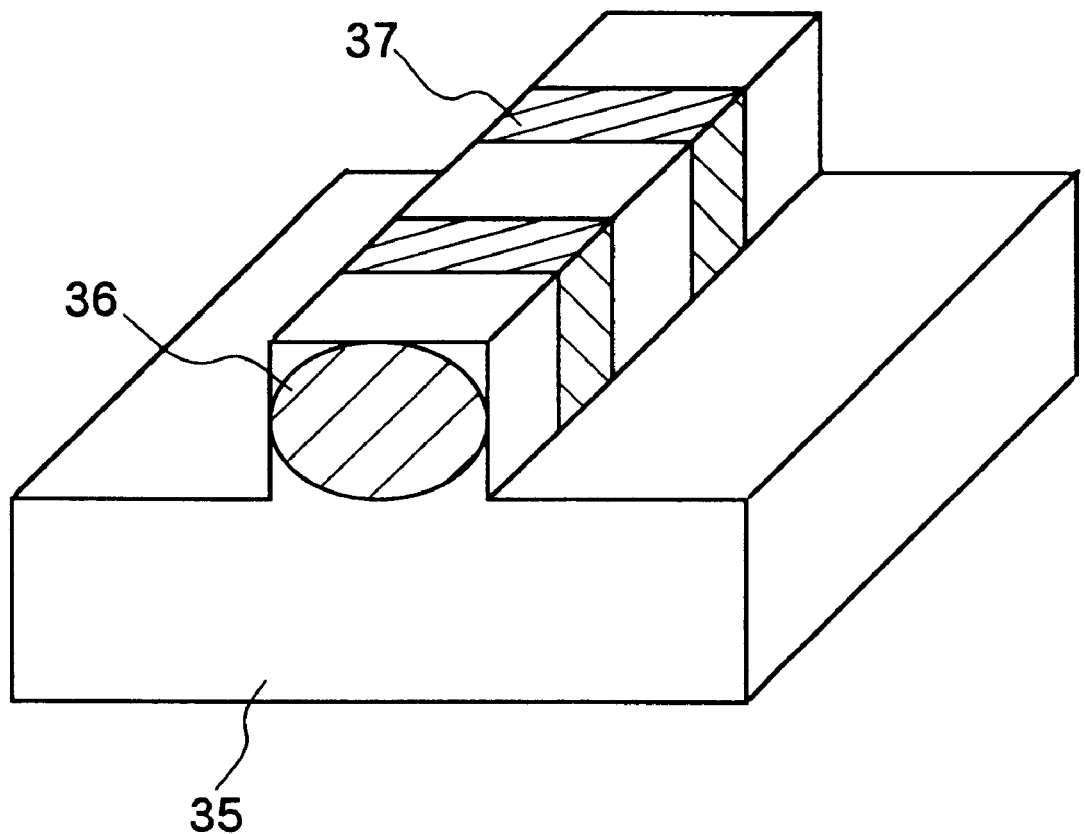
FIG. 4 is an explanatory drawing of a ridge QPM-SHG device according to the first embodiment of the present invention.

The present embodiment employs the optical waveguide device in which the laser beam waveguide mode of the optical waveguide is asymmetric with respect to the intensity peak. However, when the laser beam waveguide mode of the optical waveguide is symmetric with respect to the intensity peak, $\Delta \cong 0$ holds. For instance, when a ridge QPM-SHG device 35 as shown in FIG. 4 is produced, the laser beam waveguide mode of an optical waveguide 36 is symmetric with respect to the intensity peak.

In the present embodiment, glass beads were used as the spherical bodies. Besides the glass material, however, even when using acrylic resin, polydivinylbenzene-containing resin material, formaldehyde condensate resin, or ceramics as the material of the spherical bodies, spherical bodies with the same grain size precision as that of the glass beads can be obtained and the position control in the height direction also can be achieved with high precision. However, when the grain size of the spherical bodies exceeds 10 μm, it becomes difficult to produce the spherical bodies and their grain size precision may deteriorate. Therefore, in order to achieve the position control in the height direction with high precision, preferably, spherical bodies with a grain size of not more than 10 μm are used.

A mounting method of the present invention is described with reference to FIGS. 5A to 5D. First, a plurality of glass beads 11 with a mean grain diameter (φ) of 2.7 μm were applied to the surface of the SHG device 2 at which the optical waveguide was formed (hereinafter referred to as an "optical waveguide formation surface"). As the application method, a method was employed that included mixing a plurality of glass beads 11 with acetone, stirring well, and applying a trace amount of the mixture to the optical waveguide formation surface. The acetone was evaporated and thus a layer with glass beads 11 dispersed on the optical waveguide formation surface was formed. When using such a method, a single layer of the glass beads 11 can be formed and thus the position adjustment in the height direction can be carried out with higher precision. In the present embodiment, the glass beads 11 were applied to the SHG device 2. However, no problem was caused even when the glass beads 11 were applied to the Si submount 4.

Figure 5A:
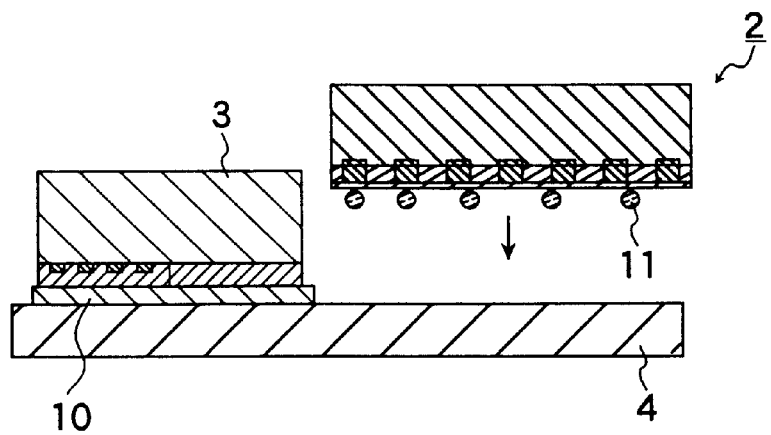
FIGS. 5A to 5D are assembly drawings of the SHG blue light source according to the first embodiment of the present invention.
Figure 5B:
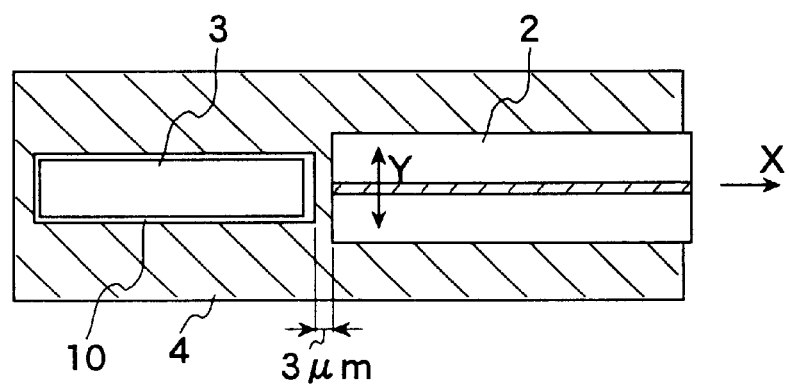

As shown in FIG. 5B, optical coupling adjustment was carried out while the semiconductor laser was allowed to emit a beam. The SHG device 2 was placed on the Si submount 4 on which the DBR semiconductor laser 3 had been mounted. The SHG device was fixed to a vacuum pincette and was moved for the adjustment. In the present embodiment, since the position adjustment in the height direction automatically was made by the glass beads 11, the adjustments were carried out with respect to an optical axis direction X and a width direction (a direction perpendicular to the optical axis direction X) Y. The distance between the opposed ends of the semiconductor laser and the SHG device was set to be 3 μm. Then, the position adjustment in the width direction Y was carried out so that a peak output of the laser beam obtained from the emission end face of the optical waveguide can be obtained while the semiconductor laser and the SHG device were moved relative to each other in the width direction Y. Thus, the position adjustments in the optical axis direction X and the width direction Y were completed.

Figure 5C:
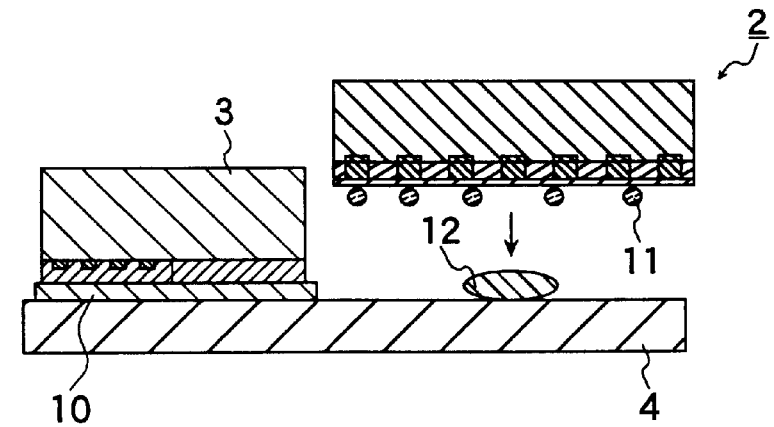
Figure 5D:
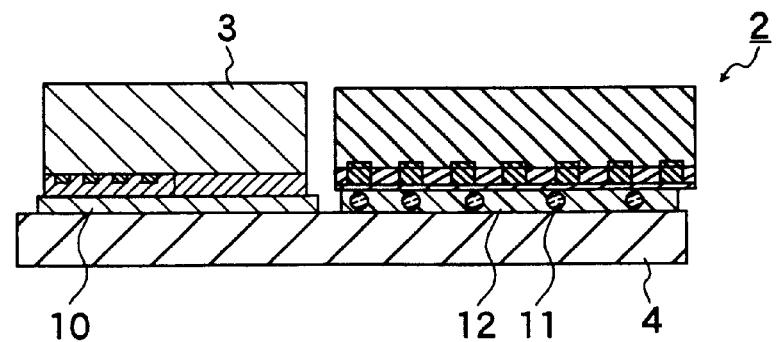

In order to fix the SHG device 2, the SHG device 2 was moved upward in the direction perpendicular to the Si submount 4. Then, an ultraviolet curable agent 12 was applied to the Si submount 4 with the DBR semiconductor laser 3 mounted thereon (FIG. 5C). In the present embodiment, an epoxy-based adhesive obtained by cationic polymerization was used and its viscosity was about 1000 cps. Afterward, the SHG device 2 was moved downward in the direction perpendicular to the Si submount 4 and was placed in a position where the peak output was obtained while the semiconductor laser was allowed to emit a beam. Then, an irradiation of ultraviolet lays were carried out for about 30 seconds while a load was applied to the SHG device 2. Thus, the SHG device 2 was fixed (FIG. 5D). It is necessary to apply a load to the SHG device 2 to arrange the glass beads 11 in a single layer. However, when the mounting is carried out under a load set to be 500 g or more, the SHG device 2 may be damaged in some cases. Therefore, it is desirable that the load applied to the SHG device 2 is not more than 500 g.

Figure 6A:
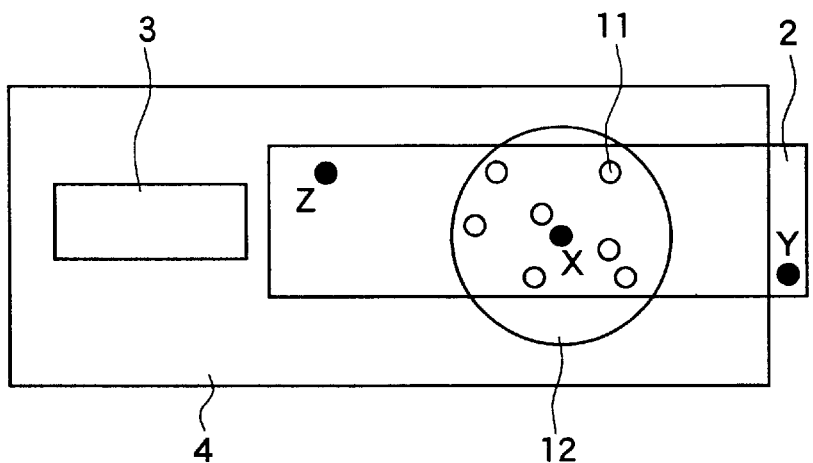
FIGS. 6A to 6C are drawings explaining load positions according to the first embodiment of the present invention.
Figure 6B:
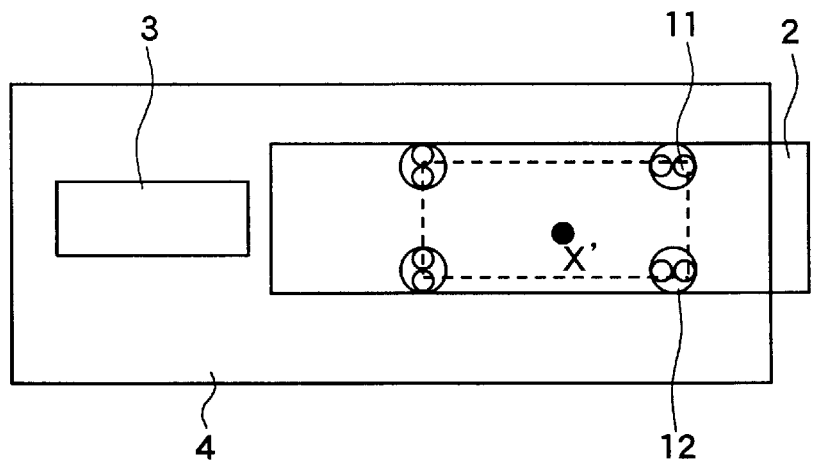

In order to control the gap between the Si submount 4 and the SHG device 2 with high precision, attention also should be paid to the position where the load is applied. In order to control the gap between the Si submount 4 and the SHG device 2 with high precision, the load is required to be applied to a position located in the vicinity of the center of a region where the glass beads 11 are placed and on the SHG device 2 as shown in FIG. 6A. When the glass beads 11 are positioned in one place in a gathered state as shown in FIG. 6A, a load may be applied to the vicinity of the point X shown in the figure located on the SHG device 2 and inside the region where the glass beads are placed. When the load center is located at a point Y or Z, the SHG device 2 cannot be mounted in parallel to the Si submount 4. This results in the gap between the Si submount 4 and the SHG device 2 not being controlled with high precision. When the glass beads 11 are divided to be placed in a few places (four places in FIG. 6B) as shown in FIG. 6B, the region in which the glass beads are placed is defined as indicated by the broken line in the figure. Similarly in this case, it is required to apply a load to the vicinity of the point X' located on the SHG device 2 and in the vicinity of the center of the region where the glass beads 11 are placed.

Figure 6C:
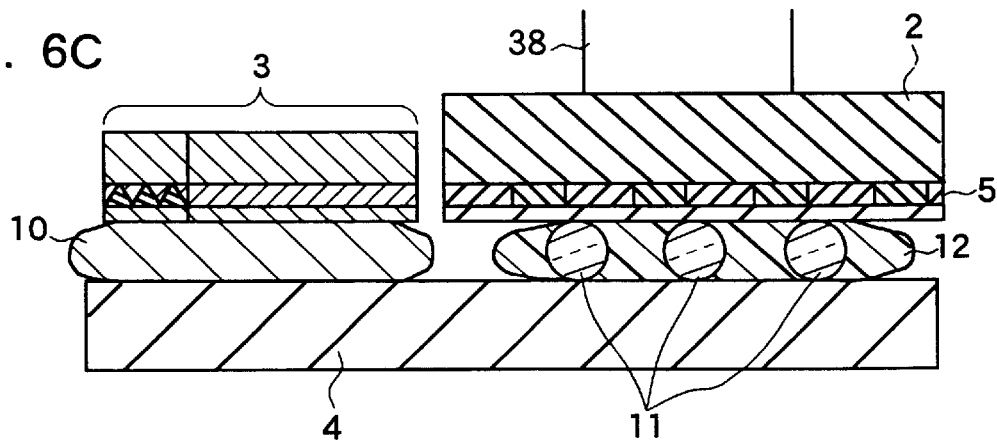

Furthermore, attention also should be paid to the size of a jig used for applying the load to the SHG device 2. In the present embodiment, the load was applied to the SHG device 2 using a vacuum pincette. When the area of a portion of a jig 38 for applying a load coming into contact with the SHG device 2 is smaller than the area of the SHG device 2 as shown in FIG. 6C, it is easy to apply the load to the point X shown in FIG. 6A or the point X' shown in FIG. 6B located on the SHG device 2 and inside the region where the glass beads are placed. When the area of a portion, of the jig 38 for applying a load, coming into contact with the SHG device 2 is larger than the area of the SHG device 2, not only may it be difficult to apply the load to the point X shown in FIG. 6A or the point X' shown in FIG. 6B located on the SHG device 2 and inside the region where the glass beads are placed, but also ultraviolet rays with which the ultraviolet curable agent 12 is to be irradiated are blocked. This results in defective fixing of the SHG device 2 to the Si submount 4. For the reason described above, it is preferable that the area of a portion of the jig for applying a load to the SHG device 2 coming into contact with the SHG device 2 is smaller than the area of the SHG device 2.

With respect to a 50-mW semiconductor laser output, a 25-mW laser beam was coupled to the optical waveguide. The wavelength of the DBR semiconductor laser 3 was allowed to coincide with the phase matched wavelength of the SHG device, so that 3-mW blue light with a wavelength of 410 nm was obtained.

Generally, the adhesive shrinks upon being cured. Therefore, when the adhesive is cured after the optical coupling adjustment, the optical coupling efficiency at the time of the adjustment differs from that after fixing. In the present embodiment, however, glass beads are present between the SHG device and the Si submount. Therefore, the misalignment in the height direction is not caused even when the adhesive shrinks upon being cured. Thus, the configuration of the present embodiment has a significant practical effect.

The ultraviolet curable agent can be cured by irradiation of ultraviolet rays. Therefore, the SHG device can be fixed in a short time by irradiation of ultraviolet rays after the optical coupling adjustment. Consequently, stable fixing is achieved. In the case of using a thermosetting adhesive or the like, a shift in the position determined by the optical coupling adjustment may occur during heating. Therefore, the ultraviolet curable agent is a preferable adhesive in a method in which an optical coupling adjustment is carried out while a semiconductor laser is allowed to emit a beam as in the present embodiment (hereinafter referred to as an "active alignment mounting"). Furthermore, in the substrate for a wavelength conversion device intended to generate blue light such as the Mg-doped $LiNbO_3$ substrate, since light in a wavelength range up to about 300 nm is transparent, the ultraviolet curable agent is a preferable adhesive.

Figure 7A:
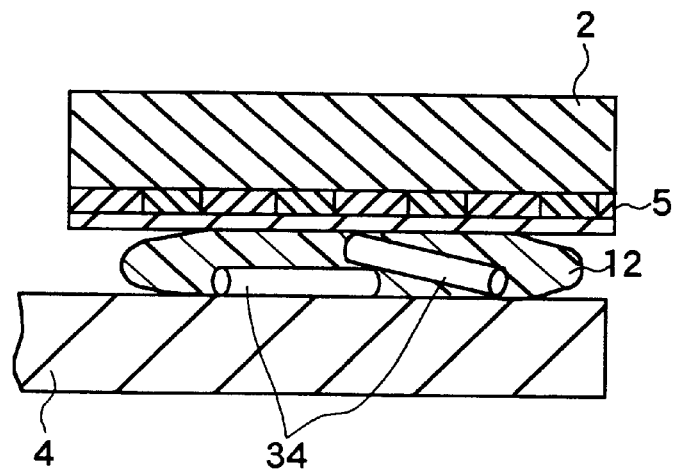
FIGS. 7A and 7B are drawings explaining a mounting method using cylindrical bodies according to the first embodiment of the present invention.
Figure 7B:
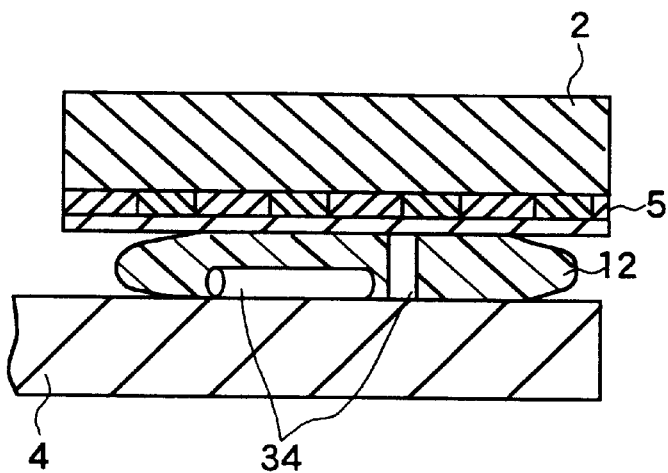

In the present embodiment, spherical glass beads were used. However, the same effect also can be obtained in the case of using fiber-like (cylindrical) bodies. Furthermore, their diameter can be adjusted with higher precision and therefore the fiber-like bodies are preferable. In this case, when using cylindrical bodies with a length of 100 $\mu$m or longer, the cylindrical bodies 34 tend to overlie one on top of another as shown in FIG. 7A, since they are too long. Consequently, it is difficult to arrange them in a single layer. On the other hand, when the cylindrical bodies have lengths not more than 10 $\mu$m, the cylindrical bodies may stand. This may deteriorate the precision of the gap between the Si submount 4 and the SHG device 2. For the reason described above, it is desirable that the cylindrical bodies have a mean length of 10 $\mu$m to 100 $\mu$m.

In the present embodiment, the glass beads were used for the adjustment in the height direction. Glass has poor thermal conductivity. For the optical waveguide QPM-SHG device, it is important to have temperature uniformity since the phase matching is satisfied by periodical polarization reversal. The heat generated by the semiconductor laser is transmitted through the Si submount and causes nonuniformity in the temperature of the SHG device. When the glass beads with low thermal conductivity are interposed as in the present embodiment, the uniformity in temperature of the SHG device can be maintained. Therefore, high-efficiency wavelength conversion can be achieved. This provides a significant effect.

In the present embodiment, the optical waveguide quasi-phase-matched second harmonic generation (QPM-SHG) device produced on a Mg-doped $LiNbO_3$ substrate was used as a planar optical waveguide device. In such a blue light source, the power of the blue light obtained is proportional to the square of the power of a fundamental wave to be coupled. Therefore, the improvement in optical coupling efficiency is particularly important. The configuration of the present embodiment capable of obtaining highly stable optical coupling characteristics is a practical means and provides a significant effect. In addition, since the Si submount and the SHG device are not in direct contact due to the presence of the spherical or cylindrical bodies, the influence of the heat generation by the semiconductor laser is considerably small. Therefore, the uniformity in temperature is maintained in the SHG device. This provides a significant practical effect.

Second Embodiment

In the present embodiment, a planar optical waveguide device is fixed to a submount using an adhesive with spherical or cylindrical bodies mixed therein and the position in the height direction of an optical waveguide in the planar optical waveguide device is controlled with high precision. Thus, high-efficiency optical coupling is achieved. Similarly in the present embodiment, the description is directed to a SHG blue light source with an optical waveguide quasi-phase-matched second harmonic generation (QPM-SHG) device as a planar optical waveguide device and a wavelength-variable DBR semiconductor laser as a semiconductor laser. The optical waveguide QPM-SHG device is produced on a Mg-doped $LiNbO_3$ substrate. The DBR semiconductor laser has a wavelength varying function.

As described in the first embodiment, the distance from the Si submount to an emission center of the semiconductor laser is 5 $\mu$m. The waveguide mode of a fundamental wave in the SHG device had a full width at half maximum of 3 $\mu$m with respect to a thickness direction. The distance from the substrate surface to a position where the intensity of the transverse mode reached its peak was 2 $\mu$m. In order to achieve optical coupling with high efficiency, it is required to adjust the position of the SHG device in the height direction. As in the first embodiment, the size of spherical glass beads 11 was determined so that a maximum optical coupling efficiency was obtained in coupling between the waveguide mode of the SHG device 2 and the emission mode of the semiconductor laser.

A mounting method is described with reference to FIGS. 8A to 8D.

In the first embodiment, glass beads were mixed with acetone, which was stirred well. A trace amount of the material thus obtained was applied to the optical waveguide formation surface of the SHG device. As a result, a layer of the glass beads dispersed on the optical waveguide formation surface was formed. Afterwards, an ultraviolet curable agent was applied to the Si submount, the position of the SHG device in the height direction was adjusted, and then the SHG device was fixed to the Si submount. In the present embodiment, a method was employed as a simpler mounting method, in which the position of the optical waveguide QPM-SHG device 16 in the height direction was adjusted using an adhesive prepared by mixing a plurality of glass beads 14 having a mean grain size ($\phi$) of 2.7 $\mu$m with an ultraviolet curable agent 13, and then the SHG device 16 was fixed to the Si submount 15.

In the present embodiment, an epoxy-based material obtained by cationic polymerization was used as the ultraviolet curable agent. A trace amount of glass beads 14 was mixed with the ultraviolet curable agent, which then was stirred well. The ultraviolet curable agent 13 containing the glass beads 14 was applied to the Si submount 15 with a wavelength-variable DBR semiconductor laser 17 mounted thereon. The glass beads 14 were mixed with the ultraviolet curable agent 13 in a ratio of about 10 vol. %, which was used in the present embodiment. When the ratio of the glass beads 14 in the ultraviolet curable agent 13 is excessively high, it is difficult to stir the glass beads 14 uniformly and the ultraviolet curable agent 13 is applied to the submount 15 with glass beads 14 gathering together. Consequently, it may be difficult to arrange the glass beads 14 in a single layer in some cases. Therefore, it is desirable that the ratio of the glass beads 14 in the ultraviolet curable agent 13 does not exceed 30 vol. %.

In the first embodiment, the position of the SHG device 16 was adjusted so that a maximum optical coupling efficiency was obtained, while the semiconductor laser was allowed to emit a beam. In the present embodiment, the position adjustment was carried out by image processing using markers M1 and M2 formed on the Si submount 15 and the SHG device 16. Thus, a passive alignment mounting was carried out. Additionally, markers M3 were formed on the DBR semiconductor laser 17 and thus the semiconductor laser 17 was fixed to the Si submount 15 with high precision. The position accuracy by the image processing did not exceed ±0.2 $\mu$m.

Figure 8A:
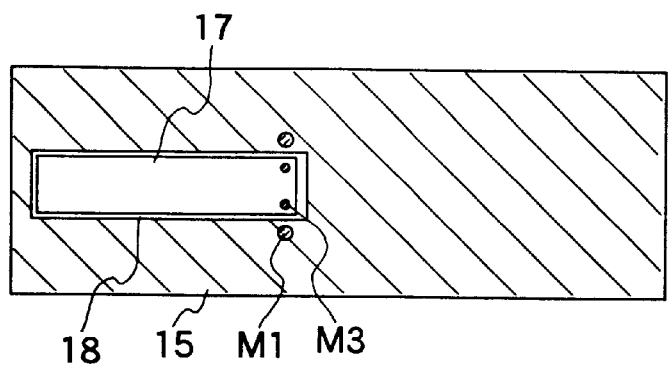
FIGS. 8A to 8D are assembly drawings of a SHG blue light source according to a second embodiment of the present invention.

FIG. 8A explains the methods of adjusting and mounting the DBR semiconductor laser 17. Two markers M3 on the semiconductor laser 17 were detected and the midline between them was determined. Then, two markers M1 on the Si submount 15 were detected and the midline between them also was determined. The position adjustment was carried out so that the respective midlines coincided with each other. Then, a solder 18 on the Si submount 15 was melted. Thus, the semiconductor laser 17 was fixed to the Si submount 15.

Figure 8B:
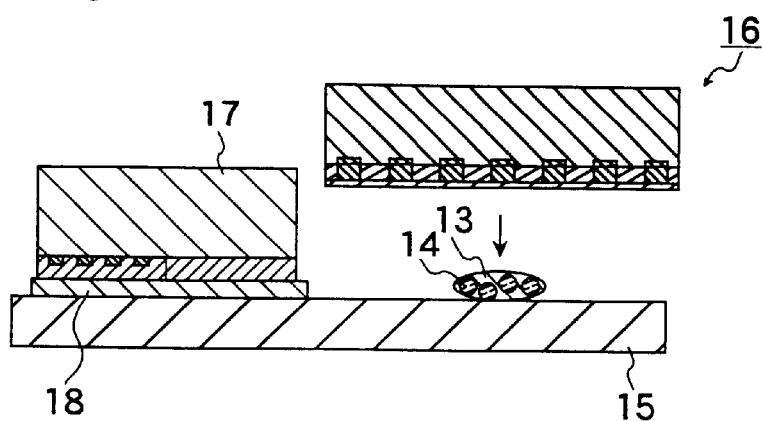

As shown in FIG. 8B, the ultraviolet curable agent 13 containing glass beads 14 mixed therewith was applied to the Si submount 15 with the semiconductor laser 17 mounted thereon.

Figure 8C:
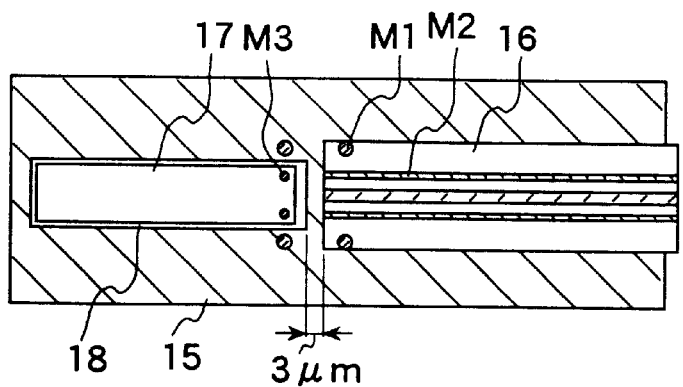
Figure 8D:
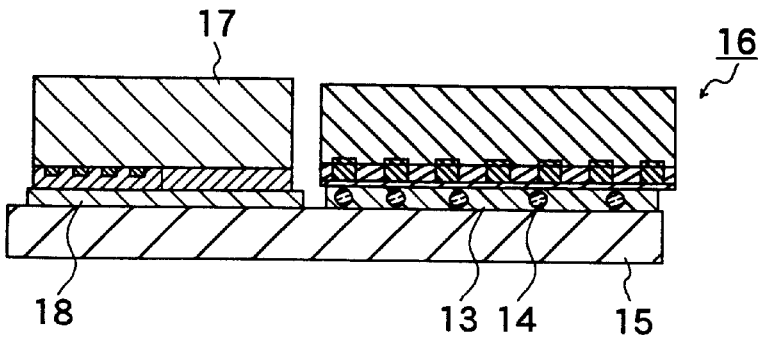

FIG. 8C explains the methods of adjusting and mounting the SHG device 16. The SHG device was fixed to a vacuum pincette and was moved for the adjustment. Opposed end faces of the semiconductor laser 17 and the QPM-SHG device 16 were detected and the space therebetween was adjusted to be 3 $\mu$m. Then, two stripe markers M2 on the QPM-SHG device 16 were detected and the midline between them was determined. At the same time, two markers M1 on the Si submount 15 also were detected and the midline between them was determined. The position adjustment in the width direction was carried out so that the respective midlines coincide with each other. Then, an irradiation of ultraviolet rays was conducted for 30 seconds while a load was applied to the QPM-SHG device 16. Thus, the QPM-SHG device 16 was fixed to the Si submount 15 (FIG. 8D). In order to arrange the glass beads 14 in a single layer, it is required to apply a load to the QPM-SHG device 16. However, when the mounting is carried out under a load of 500 g or more, the QPM-SHG device 16 may be damaged in some cases. Therefore, it is desirable that the load applied to the QPM-SHG device 16 does not exceed 500 g.

In order to control the gap between the Si submount 15 and the SHG device 16 with high precision, attention also should be paid to the position where the load is applied. In order to control the gap between the Si submount 15 and the SHG device 16 with high precision, the load is required to be applied to a position located on the SHG device 16 and in the vicinity of the center of a region where the glass beads 14 are placed, for the reason described in the first embodiment.

Furthermore, for the reason described in the first embodiment, it is preferable that the area of a portion of a jig for applying a load to the SHG device 16 coming into contact with the SHG device 16 is smaller than the area of the SHG device 16.

In the present embodiment, the position adjustment in the height direction is made automatically by the glass beads. In addition, the position adjustments in the optical axis direction and in the width direction were made through image processing by detecting the space between opposed surfaces and the markers, respectively. With respect to a 50-mW semiconductor laser output, a 25-mW laser beam was coupled to the optical waveguide. The wavelength of the DBR semiconductor laser was allowed to coincide with the phase matched wavelength of the SHG device, so that 3-mW blue light with a wavelength of 410 nm was obtained. The mounting was completed with the same precision as that in the active alignment mounting. The configuration according to the present embodiment also exhibits a significant practical effect in the passive alignment mounting.

Generally, the adhesive shrinks upon being cured. Therefore, when the adhesive is cured after the optical coupling adjustment, the optical coupling efficiency at the time of the adjustment differs from that after the fixing. In the present embodiment, however, glass beads are present between the SHG device and the Si submount. Therefore, the misalignment in the height direction is not caused even when the adhesive shrinks upon being cured. Thus, the configuration of the present embodiment has a significant practical effect.

The ultraviolet curable agent can be cured by irradiation of ultraviolet rays. Therefore, the SHG device can be fixed in a short time by irradiation of ultraviolet rays after the optical coupling adjustment. Consequently, stable fixing is achieved. In the case of using a thermosetting adhesive or the like, a shift in the position determined by the optical coupling adjustment may occur during heating. Furthermore, in the substrate for a wavelength conversion device intended to generate blue light such as the Mg-doped LiNbO$_3$ substrate, since light in a wavelength range up to about 300 nm is transparent, the ultraviolet curable agent is a preferable adhesive.

In the present embodiment, spherical glass beads were used. However, the same effect also can be obtained in the case of using fiber-like (cylindrical) bodies. Furthermore, their diameter can be adjusted with higher precision and therefore the fiber-like bodies are preferable. For the reason described in the first embodiment, it is desirable that the cylindrical bodies have a length of 10 μm to 100 μm.

In the present embodiment, the glass beads were used for the adjustment in the height direction. Glass has poor thermal conductivity. For the SHG device, it is important to have temperature uniformity since the phase matching is satisfied by periodical polarization reversal. The heat generated by the semiconductor laser is transmitted through the Si submount, and this causes nonuniformity in the temperature of the SHG device. When the glass beads with poor thermal conductivity are interposed as in the present embodiment, the uniformity in temperature of the SHG device can be maintained. Thus, high-efficiency wavelength conversion can be achieved. This provides a significant effect.

In the present embodiment, the optical waveguide quasi-phase-matched second harmonic generation (QPM-SHG) device produced on a Mg-doped $LiNbO_3$ substrate was used as a planar optical waveguide device. In such a blue light source, the power of the blue light obtained is proportional to the square of the power of a fundamental wave to be coupled. Therefore, the improvement in optical coupling efficiency is particularly important. The configuration of the present embodiment capable of obtaining highly stable optical coupling characteristics is a practical means and has a significant effect. In addition, since the Si submount and the SHG device are not in direct contact due to the presence of the spherical or cylindrical bodies, the influence of the heat generation by the semiconductor laser is considerably small. Therefore, the uniformity in temperature is maintained in the SHG device. This provides a significant practical effect.

Third Embodiment

In the present embodiment, the description is directed to a mounting method used for manufacturing an optical waveguide device integrated module. A semiconductor laser and an optical waveguide device including an optical waveguide formed at the surface of its substrate are mounted on a submount with an active layer and an optical waveguide formation surface facing the submount, respectively. After the semiconductor laser is fixed to the submount, an adhesive is applied to the submount. Then, the adjustment of optical coupling between the semiconductor laser and the optical waveguide device is carried out with the adhesive being present between the optical waveguide and the submount. Afterward, the optical waveguide device is fixed. In other words, the description is directed to a method in which the optical coupling adjustment is carried out with the adhesive applied to the Si submount prior to the adjustment. In the first embodiment, initially, the optical coupling adjustment was carried out. Next, the SHG device was moved upward in the direction perpendicular to the Si submount, and then the adhesive was applied to the Si submount. Afterward, the SHG device was moved downward in the direction perpendicular to the Si submount. Thus, the SHG device was mounted. In this process, however, the SHG device is required to be moved downward onto the Si submount twice. Therefore, it takes a longer time for the mounting. The mounting method of the present invention is described with reference to FIGS. 9A to 9C.

As described in the first embodiment, the distance from the Si submount to an emission center of the semiconductor laser is 5 μm. The waveguide mode of the fundamental wave in the optical waveguide QPM-SHG device had a full width at half maximum of 3 μm with respect to the thickness direction. The distance from the substrate surface to a position where the intensity of the transverse mode reached its peak was 2 μm. In order to achieve the optical coupling with high efficiency, it is required to adjust the position of the SHG device in the height direction. As in the first embodiment, the size of spherical glass beads 22 was determined so that a maximum optical coupling efficiency was obtained in coupling between the waveguide mode of the SHG device 2 and the emission mode of the semiconductor laser.

As in the second embodiment, spherical glass beads 22 with a grain size of 2.7 μm were mixed with an ultraviolet curable agent 21 in a ratio of about 10 vol. % and used in the present embodiment. When the ratio of the glass beads 22 in the ultraviolet curable agent 21 is excessively high, it is difficult to stir the glass beads 22 uniformly and thus the ultraviolet curable agent 21 is applied to the submount 23 with glass beads 22 gathering together. Consequently, it may be difficult to arrange the glass beads 22 in a single layer in some cases. Therefore, it is desirable that the ratio of the glass beads 22 in the ultraviolet curable agent 21 does not exceed 30 vol. %.

Figure 9A:
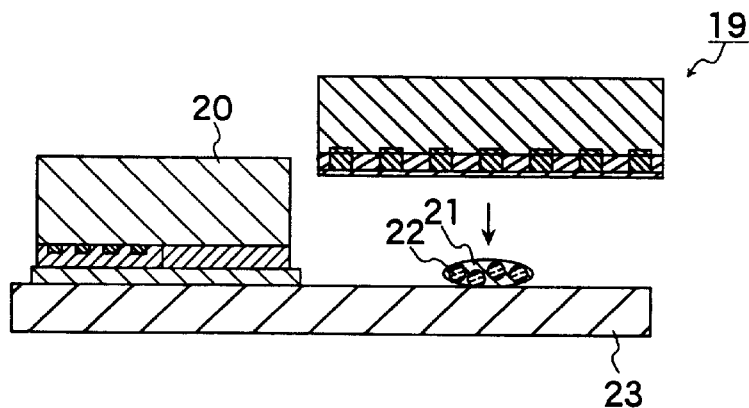
FIGS. 9A to 9C are assembly drawings of a SHG blue light source according to a third embodiment of the present invention.
Figure 9B:
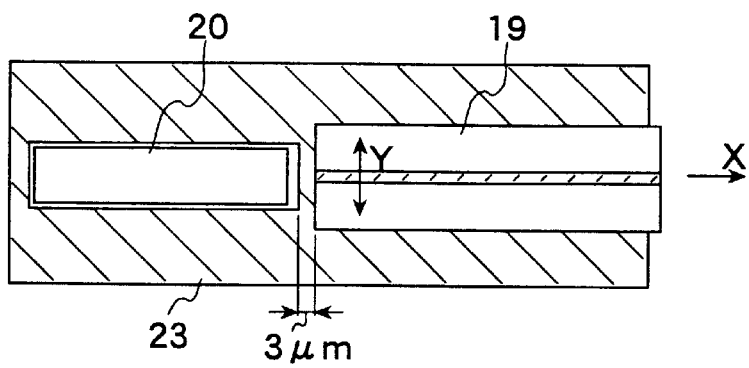
Figure 9C:
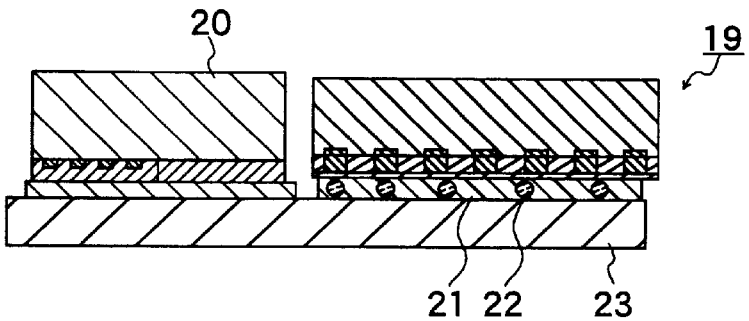

As shown in FIG. 9A, the ultraviolet curable agent 21 containing 2.7-μm spherical glass beads 22 mixed therewith was applied to the Si submount 23 with a wavelength-variable DBR semiconductor laser 20 mounted thereon. Next, the optical coupling adjustment was carried out while the semiconductor laser was allowed to emit a beam. As shown in FIG. 9B, an optical waveguide QPM-SHG device 19 was placed on the Si submount 23 with the DBR semiconductor laser 20 mounted thereon. The SHG device was fixed to a vacuum pincette and was moved for the adjustment. In the present embodiment, the position adjustment in the height direction automatically was made by the glass beads 22. Therefore, the adjustments were carried out with respect to the optical axis direction and the width direction. The space between the opposed end faces of the semiconductor laser and the SHG device was set to be 3 μm. The adjustment in the width direction was carried out so that a peak output of a laser beam obtained from the emission end face of the optical waveguide was obtained while the semiconductor laser and the SHG device were moved relative to each other in the width direction. Then, an irradiation of ultraviolet rays was conducted for about 30 seconds while a load was applied to the SHG device 19. Thus, the SHG device 19 was fixed (FIG. 9C). It is necessary to apply a load to the SHG device 19 to arrange the glass beads 22 in a single layer. However, when the mounting is carried out under a load set to be 500 g or more, the SHG device 19 may be damaged in some cases. Therefore, it is desirable that the load applied to the SHG device 19 does not exceed 500 g.

In order to control the gap between the Si submount 23 and the SHG device 19 with high precision, attention also should be paid to the position where the load is applied. In order to control the gap between the Si submount 23 and the SHG device 19 with high precision, the load is required to be applied to a position located on the SHG device 19 and in the vicinity of the center of a region where the glass beads 22 are placed, for the reason described in the first embodiment.

Furthermore, for the reason described in the first embodiment, it is preferable that the area of a portion of a jig for applying a load to the SHG device 19 coming into contact with the SHG device 19 is smaller than the area of the SHG device 19.

With respect to a 50-mW semiconductor laser output, a 25-mW laser beam was coupled to the optical waveguide.

The wavelength of the DBR semiconductor laser was allowed to coincide with the phase matched wavelength in the SHG device, so that 3-mW blue light with a wavelength of 410 nm was obtained.

As described above, in the mounting method used for manufacturing an optical waveguide device integrated module of the present invention, the optical coupling adjustment is simplified and thus the time required for mounting is shortened considerably. Thus, the method has a significant practical effect.

Figure 10:
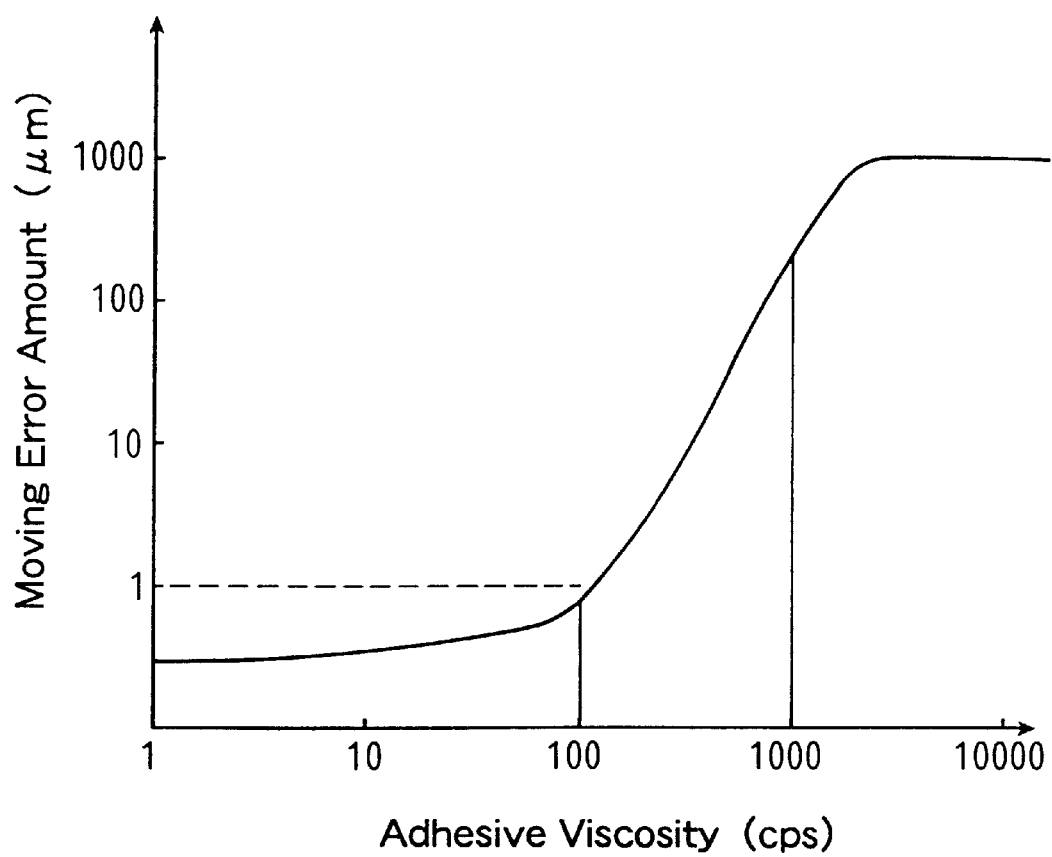
FIG. 10 is a graph showing the moving accuracy and viscosity of an ultraviolet curing agent according to the third embodiment of the present invention.

In the present embodiment, an ultraviolet curable agent with a viscosity of 20 cps was used. The SHG device was fixed to a vacuum pincette and was moved for the adjustment. When the suction power of the vacuum pincette is lower than the pulling force produced by the viscosity of the adhesive, the SHG device cannot be moved. FIG. 10 shows the results obtained when an adhesive was applied between the SHG device and the submount and the SHG device was held by suction by the vacuum pincette for movement. The horizontal axis indicates the viscosity of the adhesive and the vertical axis an moving error amount in the case where the SHG device was moved by 1 mm. When the viscosity was 100 cps or lower, the moving error amount was not more than 1 $\mu$m. When the viscosity reached around 1000 cps, a moving error amount was about several hundreds of micrometers. As a result, practically, a viscosity of 100 cps or lower is preferable for carrying out the position adjustment of the SHG device after the application of an adhesive as in the present embodiment. However, the viscosity of the adhesive depends on the SHG device and the suction power of a jig (the vacuum pincette in the present embodiment). Therefore, the viscosity of usable adhesives can be increased by the increases in the area subjected to suction and in suction power or by the strong fixing of the SHG device to a vacuum chuck or the like instead of the vacuum pincette.

Generally, the adhesive shrinks upon being cured. Hence, when the adhesive is cured after the optical coupling adjustment, the optical coupling efficiency at the time of the adjustment differs from that after the fixing. In the present embodiment, however, glass beads are present between the SHG device and the Si submount. Consequently, the misalignment in the height direction is not caused even when the adhesive shrinks upon being cured. Thus, the configuration of the present embodiment has a significant practical effect.

The ultraviolet curable agent can be cured by irradiation of ultraviolet rays. Therefore, the SHG device can be fixed in a short time by irradiation of ultraviolet rays after the optical coupling adjustment. Consequently, stable fixing is achieved. In the case of using a thermosetting adhesive or the like, a shift in the position determined by the optical coupling adjustment may occur during heating. Furthermore, in the substrate for a wavelength conversion device intended to generate blue light such as the Mg-doped LiNbO$_3$ substrate, since light in a wavelength range up to about 300 nm is transparent, the ultraviolet curable agent is a preferable adhesive.

In the present embodiment, spherical glass beads were used. However, the same effect also can be obtained in the case of using fiber-like (cylindrical) bodies. Furthermore, their diameter can be adjusted with higher precision and therefore the fiber-like bodies are preferable. For the reason described in the first embodiment, it is desirable that the cylindrical bodies have a length of 10 $\mu$m to 100 $\mu$m.

In the present embodiment, the adjustment in the height direction also was carried out using the glass beads. Glass has poor thermal conductivity. For the SHG device, it is important to have temperature uniformity since the phase matching is satisfied by periodical polarization reversal. The heat generated by the semiconductor laser is transmitted through the Si submount and causes nonuniformity in temperature of the SHG device. When the glass beads with poor thermal conductivity are interposed as in the present embodiment, the uniformity in temperature of the SHG device can be maintained. Thus, high-efficiency wavelength conversion can be achieved and this provides a significant effect.

In the present embodiment, the optical waveguide quasi-phase-matched second harmonic generation (QPM-SHG) device produced on a Mg-doped LiNbO$_3$ substrate was used as a planar optical waveguide device. In such a blue light source, the power of the blue light obtained is proportional to the square of the power of a fundamental wave to be coupled. Therefore, the improvement in optical coupling efficiency is particularly important. The configuration of the present embodiment capable of obtaining highly stable optical coupling characteristics is a practical means and provides a significant effect. In addition, since the Si submount and the SHG device are not in direct contact due to the presence of the spherical or cylindrical bodies, the influence of the heat generation by the semiconductor laser is considerably small. Consequently, the temperature uniformity of the SHG device is maintained in the SHG device and this provides a significant practical effect.

In the present embodiment, the space in the height direction between the SHG device and the submount can be adjusted automatically by the glass beads interposed therebetween. Hence, optical coupling adjustments were carried out with respect to the optical axis direction and the width direction. However, when the pulling force produced by the viscosity of the adhesive is set to be small, the SHG device can be moved not only an in-plane direction but also in the up-and-down direction (the height direction). Thus, the viscosity of the adhesive is set suitably, so that optical coupling adjustments can be carried out with high precision in the optical axis, width, and height directions without using the glass beads. Accordingly, high-efficiency optical coupling can be achieved.

Fourth Embodiment

In the present embodiment, the description is directed to a method of controlling the position of an active layer of a semiconductor laser with high precision. In the above-mentioned embodiments, it was intended to improve the position accuracy in the height direction of an optical waveguide QPM-SHG device by using spherical or cylindrical bodies. In the present embodiment, spherical or cylindrical bodies are placed between a semiconductor laser and a submount, so that the distance from the submount surface to the position of the active layer (i.e. the position corresponding to half the thickness of the active layer) in the semiconductor laser is controlled with high precision. Thus, high-efficiency optical coupling is achieved.

Figure 11:
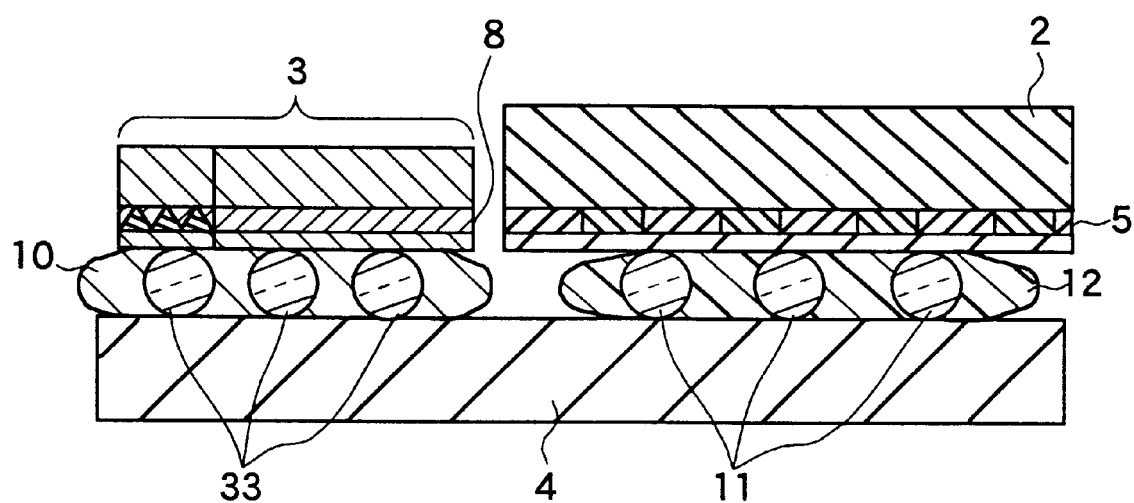
FIG. 11 is a structural view of a SHG blue light source according to a fourth embodiment of the present invention.
Figure 12:
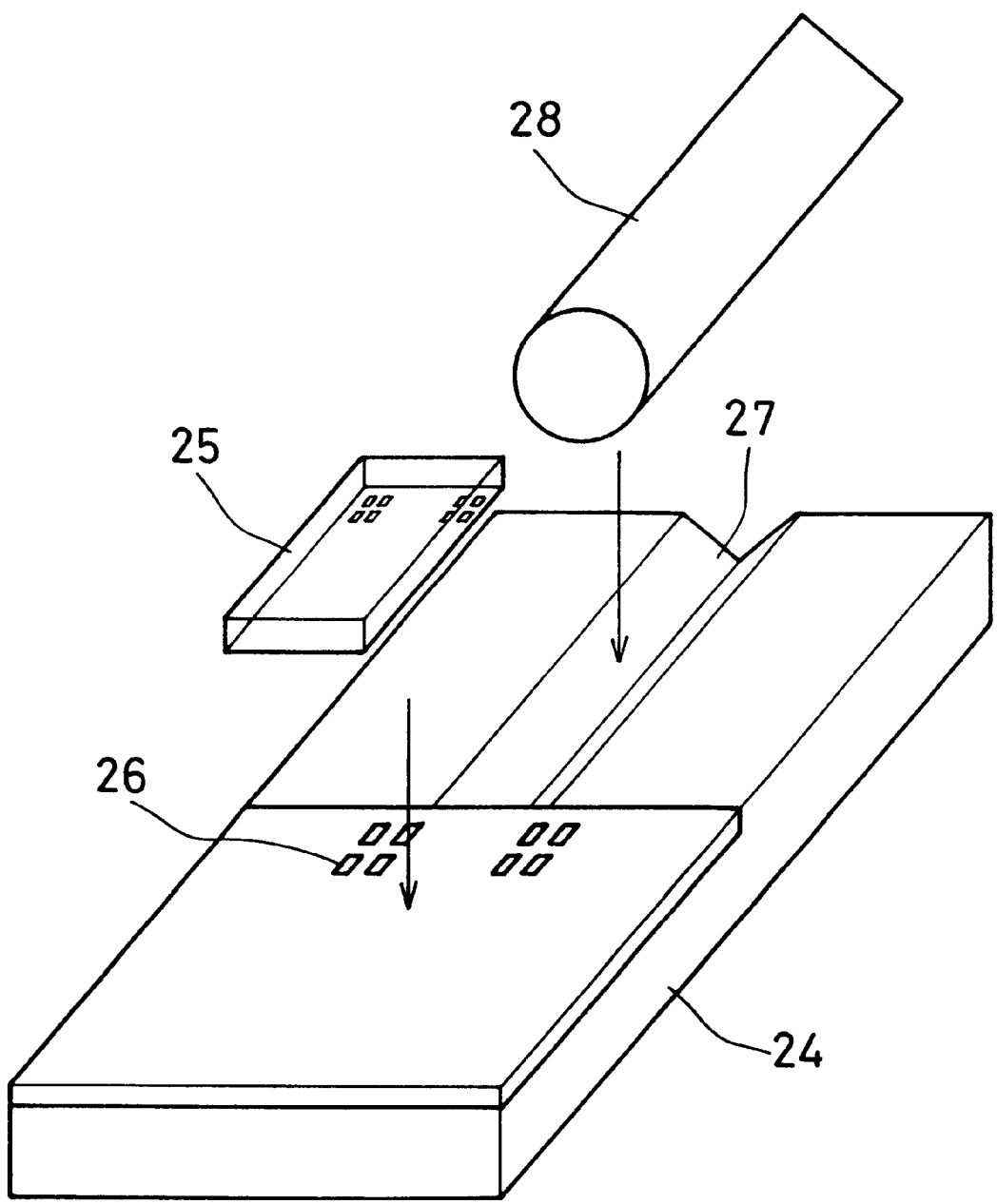
FIG. 12 is a structural view of a surface mounting optical module obtained by direct bonding according to a conventional example.
Figure 13:
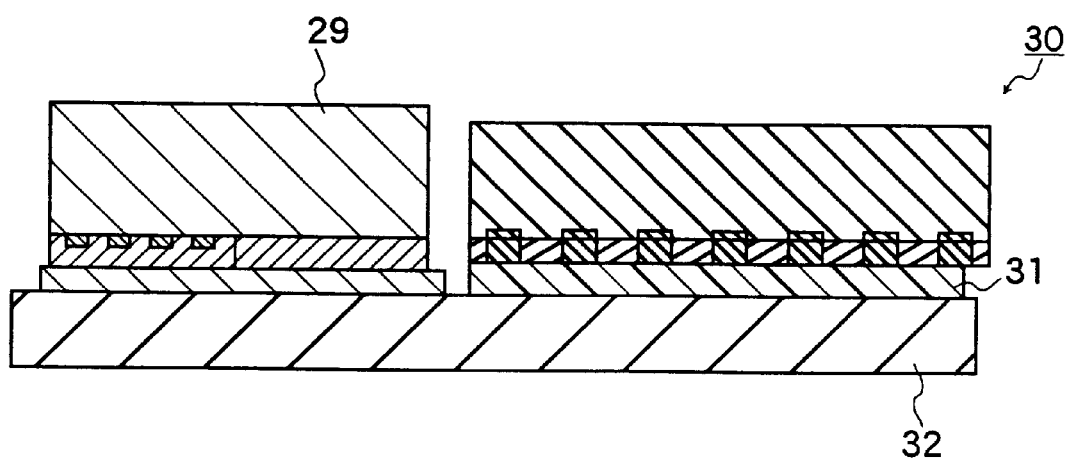
FIG. 13 is a structural view of a direct-bonding SHG blue light source according to a conventional example.

FIG. 11 shows a SHG blue light source produced according to the present invention. The same wavelength-variable DBR semiconductor laser 3 as in the embodiments described above is employed as a semiconductor laser in the present embodiment. On a Si submount 4, a Ti/Pt/Au metallized film is formed and a Pb/Sn solder 10 is formed by vacuum-evaporation in a portion on which the semiconductor laser is to be mounted. The thickness of the solder material is 3 $\mu$m.

Conventionally, the position of the DBR semiconductor laser 3 in the height direction was controlled by the adjustment of an amount of pressure applied to the DBR semiconductor laser 3 during mounting. The thickness of the solder 10 after the DBR semiconductor laser 3 was fixed was set to be 2 μm. The actual accuracy in thickness of the solder 10 was about ±0.2 μm.

Methods of reliably controlling the position of the DBR semiconductor laser 3 in the height direction with higher precision include a method using spherical or cylindrical bodies with the same diameter as that of the spherical or cylindrical bodies used in the position control of the QPM-SHG device in the height direction. In the present embodiment, spherical glass beads were used. The mean grain size of the glass beads 33 was set to be 2 μm. For the reason described in the first embodiment, it is desirable that the spherical bodies have a grain size of 10 μm or smaller.

The glass beads 33 were placed between the DBR semiconductor laser 3 and the submount 4 and then the solder 10 was melted while a load was applied to the DBR semiconductor laser 3. Thus, the DBR semiconductor laser 3 was fixed to the submount 4. The glass beads 33 serve as a stopper and thus the thickness of the solder 10 can be controlled with high precision. In order to control the gap between the DBR semiconductor laser 3 and the Si submount 4 with high precision, attention also should be paid to the position where the load is applied. In order to control the gap between the Si submount 4 and the DBR semiconductor laser 3 with high precision, the load is required to be applied to a position located on the DBR semiconductor laser 3 and in the vicinity of the center of a region where the glass beads 33 are placed, for the reason described in the first embodiment.

Furthermore, for the reason described in the first embodiment, it is preferable that the area of a portion of a jig for applying a load to the DBR semiconductor laser 3 coming into contact with the DBR semiconductor laser 3 is smaller than the area of the DBR semiconductor laser 3.

As a result, the distance from the submount 4 to an active layer 8 of the DBR semiconductor laser 3 also can be controlled reliably with high precision. The variation in mean grain size of the glass beads was ±0.1 μm. Therefore, the thickness of the solder 10 was controlled with high precision and thus the accuracy in thickness of the solder 10 was improved from ±0.2 μm to ±0.1 μm. The position of an optical waveguide QPM-SHG device in the height direction also was controlled using the glass beads 11 as in the embodiments described above. Then, the SHG device was mounted on the submount 4.

With respect to a 50-mW semiconductor laser output, an at least 25-mW laser beam was coupled to an optical waveguide. The wavelength of the DBR semiconductor laser was allowed to coincide with a phase matched wavelength in the SHG device. Thus, 3-mW blue light with a wavelength of 410 nm was obtained. The thickness of the solder 10 was controlled with higher precision as compared to a conventional case, so that high-efficiency optical coupling was achieved more stably and the improvement in yield was confirmed.

The same result as in the above also can be obtained when the glass beads 33 are premixed with the solder 10. When the ratio of the glass beads 33 contained in the solder 10 is excessively high, it is difficult to distribute the glass beads 33 uniformly. In this case, the glass beads 33 may be placed on the submount 16 in a gathered state and thus it may be difficult to arrange the glass beads 33 in a single layer in some cases. Therefore, it is desirable that the ratio of the glass beads 33 in the solder 10 does not exceed 30 vol. %.

In the present embodiment, the solder was used as the adhesive for fixing the DBR semiconductor laser 3. However, a conductive adhesive also may be used. The conductive adhesive is free from lead and thus has less influence on the environment.

In the present embodiment, spherical glass beads were used. However, the same effect also can be obtained in the case of using fiber-like (cylindrical) bodies. Their diameter can be adjusted with higher precision and therefore the fiber-like bodies are preferable. For the reason described in the first embodiment, it is desirable that the cylindrical bodies have a length of 10 μm to 100 μm.

In the present embodiment, the optical waveguide quasi-phase-matched second harmonic generation (QPM-SHG) device produced on a Mg-doped $LiNbO_3$ substrate was used as a planar optical waveguide device. In such a blue light source, the power of the blue light obtained is proportional to the square of the power of a fundamental wave to be coupled. Therefore, the improvement in optical coupling efficiency is particularly important. The configuration of the present embodiment capable of obtaining highly stable optical coupling characteristics is a practical means and provides a significant effect.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An optical waveguide device integrated module, comprising:
    a semiconductor laser, including an active layer and a surface at which the active layer is formed;
    an optical waveguide device, including an optical waveguide formed on a substrate and a surface at which the optical waveguide is formed; and
    a submount,
    wherein the semiconductor laser and the optical waveguide device are mounted on the submount with both the surface at which the active layer is formed and the surface at which the optical waveguide is formed facing the submount, and
    the submount is combined with the semiconductor laser or the optical waveguide device to form one body using an adhesive with a spacer being interposed therebetween, the spacer maintaining a substantially uniform distance between the submount and the semiconductor laser or the optical waveguide device,
    wherein the spacer is formed of at least one material selected from the group consisting of glass, resins, and ceramics.

2. The optical waveguide device integrated module according to claim 1, wherein the spacer is a spherical or cylindrical body.

3. The optical waveguide device integrated module according to claim 2, wherein a relationship of $d_1+d_2+\Delta \cong d_3+d_4$ is satisfied, where $d_1$ denotes a diameter of the spherical or cylindrical body, $d_2$ a distance from the surface of the optical waveguide device to a position where an intensity of a laser beam waveguide mode of the optical waveguide reaches its peak, $d_3$ a distance from the surface of the semiconductor laser at which the active layer is formed to a position where an intensity of an emission laser beam reaches its peak, $d_4$ a thickness of the adhesive used for mounting the semiconductor laser on the submount, and $\Delta$ a distance between the position where an intensity of a laser beam waveguide mode of the optical waveguide reaches its peak and a position where a maximum optical coupling efficiency is obtained in coupling a beam emitted from the semiconductor laser to the optical waveguide.

4. The optical waveguide device integrated module according to claim 3, wherein $\Delta \cong 0$ and $\Delta = \alpha$ when the laser beam waveguide mode of the optical waveguide has a symmetric shape and an asymmetric shape with respect to a direction of a thickness of the substrate, respectively, where $\alpha$ denotes a distance between the position where an intensity of a laser beam waveguide mode of the optical waveguide reaches its peak and the position where a maximum optical coupling efficiency is obtained in coupling a beam emitted from the semiconductor laser to the optical waveguide.

5. The optical waveguide device integrated module according to claim 2, wherein the spherical body has a mean grain size of not more than 10 $\mu$m.

6. The optical waveguide device integrated module according to claim 2, wherein the cylindrical body has a mean length of 10 $\mu$m to 100 $\mu$m.

7. The optical waveguide device integrated module according to claim 1, wherein a size of the spacer is selected so that a maximum optical coupling efficiency is obtained in coupling a beam emitted from the semiconductor laser to the optical waveguide.

8. The optical waveguide device integrated module according to claim 1, wherein a plurality of spacers are present.

9. The optical waveguide device integrated module according to claim 8, wherein the plurality of spacers are arranged in a single layer between the optical waveguide device or the semiconductor laser and the submount.

10. The optical waveguide device integrated module according to claim 8, wherein an amount of the plurality of spacers mixed with the adhesive is not more than 30 vol. %.

11. The optical waveguide device integrated module according to claim 8, wherein the plurality of spacers have substantially the same size.

12. The optical waveguide device integrated module according to claim 1, wherein the spacer is mixed with the adhesive.

13. The optical waveguide device integrated module according to claim 1, wherein the optical waveguide device is a quasi-phase-matched second harmonic generation device with a region whose polarization is reversed periodically.

14. The optical waveguide device integrated module according to claim 1, wherein the adhesive in the optical waveguide device is an ultraviolet ray curable adhesive.

15. The optical waveguide device integrated module according to claim 1, wherein the adhesive used for fixing the semiconductor laser is a solder or a conductive adhesive.

16. A method of manufacturing an optical waveguide device integrated module comprising a semiconductor laser and an optical waveguide device mounted on a submount with both a surface of the semiconductor laser at which an active layer is formed and a surface of the optical waveguide device at which an optical waveguide is formed facing the submount, the method comprising mounting at least one of the semiconductor laser and the optical waveguide device on the submount with an adhesive, with a spacer between the submount and the semiconductor laser or the optical waveguide device, the spacer maintaining a substantially uniform distance between the submount and the semiconductor laser or the optical waveguide device, wherein the spacer is a spherical or cylindrical body, and the spherical or cylindrical body is formed of at least one material selected from the group consisting of glass, resins, and ceramics.

17. The method of manufacturing an optical waveguide device integrated module according to claim 16, wherein at least one of the optical waveguide device and the semiconductor laser is mounted on the submount while a load is applied to the at least one.

18. The method of manufacturing an optical waveguide device integrated module according to claim 17, wherein a center position of the load is: in a vicinity of the plurality of spacers when the plurality of spacers are positioned in one place; on a line extending between two points when the plurality of spacers are positioned in two places; or inside a region defined by lines extending between three points or more when the plurality of spacers are positioned in three places or more; and on the optical waveguide device or the semiconductor laser.

19. The method of manufacturing an optical waveguide device integrated module according to claim 17, wherein the load applied to the optical waveguide device is not more than 500 g.

20. The method of manufacturing an optical waveguide device integrated module according to claim 16, wherein a size of the spacer is selected so that a maximum optical coupling efficiency is obtained in the coupling between a beam emitted from the semiconductor laser and the optical waveguide formed in the optical waveguide device.

21. The method of manufacturing an optical waveguide device integrated module according to claim 16, wherein a plurality of spacers are provided, and the plurality of spacers are arranged in a single layer between the optical waveguide device or the semiconductor laser and the submount.

22. The method of manufacturing an optical waveguide device integrated module according to claim 21, wherein a ratio of the plurality of spacers mixed with the adhesive is not more than 30 vol. %.

23. The method of manufacturing an optical waveguide device integrated module according to claim 21, wherein the plurality of spacers have substantially the same size.

24. The method of manufacturing an optical waveguide device integrated module according to claim 16, wherein an area of a portion of a jig used in mounting the at least one of the optical waveguide device and the semiconductor laser on the submount coming into contact with the optical waveguide device or the semiconductor laser is smaller than an area of the optical waveguide device or the semiconductor laser.

25. The method of manufacturing an optical waveguide device integrated module according to claim 16, wherein the spacer is mixed with the adhesive.

26. The method of manufacturing an optical waveguide device integrated module according to claim 16, wherein a position of the optical waveguide device is adjusted with the semiconductor laser emitting a beam and then the optical waveguide device is mounted on the submount.

27. The method of manufacturing an optical waveguide device integrated module according to claim 16, wherein the optical waveguide device is a quasi-phase-matched second harmonic generation device with a region whose polarization is reversed periodically.

28. The method of manufacturing an optical waveguide device integrated module according to claim 16, wherein the adhesive is an ultraviolet curable agent.

29. The method of manufacturing an optical waveguide device integrated module according to claim 16, wherein the spherical body has a mean grain size of not more than 10 $\mu$m.

30. The method of manufacturing an optical waveguide device integrated module according to claim 17, wherein the cylindrical body has a mean length of 10 $\mu$m to 100 $\mu$m.

31. The method of manufacturing an optical waveguide device integrated module according to claim 16, wherein the adhesive is applied to the submount, an adjustment in optical coupling between the semiconductor laser and the optical waveguide device is carried out with the adhesive being present between the optical waveguide device and the submount, and then the optical waveguide device is fixed.

32. An optical waveguide device integrated module, comprising:
a semiconductor laser, including an active layer and a surface at which the active layer is formed;
an optical waveguide device, including an optical waveguide formed on a substrate and a surface at which the optical waveguide is formed; and
a submount,
wherein the semiconductor laser and the optical waveguide device are mounted on the submount with both the surface at which the active layer is formed and the surface at which the optical waveguide is formed facing the submount, and
the submount is combined with the semiconductor laser or the optical waveguide device to form one body using an adhesive with a spacer being interposed therebetween, the spacer maintaining a substantially uniform distance between the submount and the semiconductor laser or the optical waveguide device,
wherein the spacer is a spherical or cylindrical body, and the cylindrical body has a mean length of 10 $\mu$m to 100 $\mu$m.

33. The optical waveguide device integrated module according to claim 32, wherein a size of the spacer is selected so that a maximum optical coupling efficiency is obtained in coupling a beam emitted from the semiconductor laser to the optical waveguide.

34. The optical waveguide device integrated module according to claim 32, wherein a plurality of spacers are present.

35. The optical waveguide device integrated module according to claim 34, wherein the plurality of spacers are arranged in a single layer between the optical waveguide device or the semiconductor laser and the submount.

36. The optical waveguide device integrated module according to claim 34, wherein an amount of the plurality of spacers mixed with the adhesive is not more than 30 vol. %.

37. The optical waveguide device integrated module according to claim 34, wherein the plurality of spacers have substantially the same size.

38. The optical waveguide device integrated module according to claim 32, wherein the spacer is mixed with the adhesive.

39. The optical waveguide device integrated module according to claim 32, wherein a relationship of $d_1+d_2+\Delta \cong d_3+d_4$ is satisfied, where $d_1$ denotes a diameter of the spherical or cylindrical body, $d_2$ a distance from the surface of the optical waveguide device to a position where an intensity of a laser beam waveguide mode of the optical waveguide reaches its peak, $d_3$ a distance from the surface of the semiconductor laser at which the active layer is formed to a position where an intensity of an emission laser beam reaches its peak, $d_4$ a thickness of the adhesive used for mounting the semiconductor laser on the submount, and $\Delta$ a distance between the position where an intensity of a laser beam waveguide mode of the optical waveguide reaches its peak and a position where a maximum optical coupling efficiency is obtained in coupling a beam emitted from the semiconductor laser to the optical waveguide.

40. The optical waveguide device integraetd module according to claim 39, wherein $\Delta \cong 0$ and $\Delta = \alpha$ when the laser beam waveguide mode of the optical waveguide has a symmetric shape and an asymmetric shape with respect to a direction of a thichkness of the substrate, respectively, where $\alpha$ denotes a distance between the position where an intensity of a laser beam waveguide mode of the optical waveguide reaches its peak and the position where a maximum optical coupling efficiency is obtained in coupling a beam emitted from the semiconductor laser to the optical waveguide.

41. The optical waveguide device integrated module according to claim 32, wherein the optical waveguide device is a quasi-phase-matched second harmonic generation device with a region whose polarization is reversed periodically.

42. The optical waveguide device integrated module according to claim 32, wherein the spacer is formed of at least one material selected from the group consisting of glass, resins, and ceramics.

43. The optical waveguide device integrated module according to claim 32, wherein the adhesive in the optical waveguide device is an ultraviolet ray curable adhesive.

44. The optical waveguide device integrated module according to claim 32, wherein the adhesive used for fixing the semiconductor laser is a solder or a conductive adhesive.

45. The optical waveguide device integrated module according to claim 32, wherein the spherical body has a mean grain size of not more than 10 $\mu$m.

46. A method of manufacturing an optical waveguide device integrated module comprising a semiconductor laser and an optical waveguide device mounted on a submount with both a surface of the semiconductor laser at which an active layer is formed and a surface of the optical waveguide device at which an optical waveguide is formed facing the submount,
the method comprising mounting at least one of the semiconductor laser and the optical waveguide device on the submount with an adhesive, with a spacer between the submount and the semiconductor laser or the optical waveguide device, the spacer maintaining a substantially uniform distance between the submount and the semiconductor laser or the optical waveguide device,
wherein the spacer is a spherical or cylindrical body, and the cylindrical body has a mean length of 10 $\mu$m to 100 $\mu$m.

47. The method of manufacturing an optical waveguide device integrated module according to claim 46, wherein at least one of the optical waveguide device and the semiconductor laser is mounted on the submount while a load is applied to the at least one.

48. The method of manufacturing an optical waveguide device integrated module according to claim 47, wherein a center position of the load is: in a vicinity of the plurality of spacers when the plurality of spacers are positioned in one place; on a line extending between two points when the plurality of spacers are positioned in two places; or inside a region defined by lines extending between three points or more when the plurality of spacers are positioned in three places or more; and on the optical waveguide device or the semiconductor laser.

49. The method of manufacturing an optical waveguide device integrated module according to claim 47, wherein the load applied to the optical waveguide device is not more than 500 g.

50. The method of manufacturing an optical waveguide device integrated module according to claim 46, wherein a size of the spacer is selected so that a maximum optical coupling efficiency is obtained in the coupling between a beam emitted from the semiconductor laser and the optical waveguide formed in the optical waveguide device.

51. The method of manufacturing an optical waveguide device integrated module according to claim 46, wherein a plurality of spacers are provided, and the plurality of spacers are arranged in a single layer between the optical waveguide device or the semiconductor laser and the submount.

52. The method of manufacturing an optical waveguide device integrated module according to claim 51, wherein the plurality of spacers have substantially the same size.

53. The method of manufacturing an optical waveguide device integrated module according to claim 46, wherein an area of a portion of a jig used in mounting the at least one of the optical waveguide device and the semiconductor laser on the submount coming into contact with the optical waveguide device or the semiconductor laser is smaller than an area of the optical waveguide device or the semiconductor laser.

54. The method of manufacturing an optical waveguide device integrated module according to claim 46, wherein the spacer is mixed with the adhesive.

55. The method of manufacturing an optical waveguide device integrated module according to claim 54, wherein a ratio of the plurality of spacers mixed with the adhesive is not more than 30 vol. %.

56. The method of manufacturing an optical waveguide device integrated module according to claim 46, wherein a position of the optical waveguide device is adjusted with the semiconductor laser emitting a beam and then the optical waveguide device is mounted on the submount.

57. The method of manufacturing an optical waveguide device integrated module according to claim 46, wherein the optical waveguide device is a quasi-phase-matched second harmonic generation device with a region whose polarization is reversed periodically.

58. The method of manufacturing mounting an optical waveguide device integrated module according to claim 46, wherein the spherical or cylindrical body is formed of at least one material selected from the group consisting of glass, resins, and ceramics.

59. The method of manufacturing an optical waveguide device integrated module according to claim 46, wherein the adhesive is an ultraviolet curable agent.

60. The method of manufacturing an optical waveguide device integrated module according to claim 46, wherein the spherical body has a mean grain size of not more than 10 $\mu$m.

61. The method of manufacturing an optical waveguide device integrated module according to claim 46, wherein the adhesive is applied to the submount, an adjustment in optical coupling between the semiconductor laser and the optical waveguide device is carried out with the adhesive being present between the optical waveguide device and the submount, and then the optical waveguide device is fixed.

* * * * *

UNITED STATES PATENT AND TRADEMARK OFFICE
CERTIFICATE OF CORRECTION

PATENT NO. : 6,614,966 B2
DATED : September 2, 2003
INVENTOR(S) : Kitaoka et al.

It is certified that error appears in the above-identified patent and that said Letters Patent is hereby corrected as shown below:

Column 24,
Line 1, "The optical waveguide device integrated" should read -- The optical waveguide device integrated --

Signed and Sealed this

Fifteenth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,614,966 B2
DATED : September 2, 2003
INVENTOR(S) : Kitaoka et al.

It is certified that error appears in the above-identified patent and that said Letters Patent is hereby corrected as shown below:

Column 24,
Line 1, "The optical waveguide device integraetd" should read -- The optical waveguide device integrated --

Signed and Sealed this

Ninth Day of November, 2004

JON W. DUDAS
*Director of the United States Patent and Trademark Office*